United States Patent
Zamir et al.

(10) Patent No.: US 11,289,172 B2
(45) Date of Patent: Mar. 29, 2022

(54) SOFT BIT REFERENCE LEVEL CALIBRATION

(71) Applicant: Western Digital Technologies, Inc., San Jose, CA (US)

(72) Inventors: Ran Zamir, Ramat Gan (IL); Eran Sharon, Rishon Lezion (IL); Idan Goldenberg, Ramat Hasharon (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/171,617

(22) Filed: Feb. 9, 2021

(65) Prior Publication Data

US 2022/0051746 A1 Feb. 17, 2022

Related U.S. Application Data

(60) Provisional application No. 63/065,229, filed on Aug. 13, 2020.

(51) Int. Cl.
| | |
|---|---|
| *G11C 29/00* | (2006.01) |
| *G11C 29/46* | (2006.01) |
| *G11C 29/20* | (2006.01) |
| *G11C 29/10* | (2006.01) |
| *G11C 29/44* | (2006.01) |

(52) U.S. Cl.
CPC .............. *G11C 29/46* (2013.01); *G11C 29/10* (2013.01); *G11C 29/20* (2013.01); *G11C 29/44* (2013.01)

(58) Field of Classification Search
CPC ......... G11C 29/46; G11C 29/10; G11C 29/20; G11C 29/44
See application file for complete search history.

(56) References Cited

U.S. PATENT DOCUMENTS

| | | | |
|---|---|---|---|
| 8,009,472 B2 | 8/2011 | Murin et al. | |
| 8,099,652 B1 | 1/2012 | Alrod et al. | |
| 8,125,833 B2 | 2/2012 | Sharon et al. | |
| 9,437,320 B1* | 9/2016 | Nguyen | G11C 29/52 |
| 10,566,061 B2 | 2/2020 | Karakulak et al. | |
| 2014/0359202 A1 | 12/2014 | Sun et al. | |
| 2014/0362646 A1 | 12/2014 | Sharon et al. | |
| 2017/0148510 A1* | 5/2017 | Bazarsky | G11C 16/26 |
| 2018/0181462 A1* | 6/2018 | Shukla | G11C 16/26 |

OTHER PUBLICATIONS

Peleato, Borja, et al., "Adaptive Read Thresholds for NAND Flash," IEEE Transactions on Communications, vol. 63, Issue 9, Sep. 2015, 12 pages.

* cited by examiner

*Primary Examiner* — Mohammed A Bashar
(74) *Attorney, Agent, or Firm* — Vierra Magen Marcus LLP

(57) ABSTRACT

Calibration of soft bit reference levels in a non-volatile memory system is disclosed. A set of memory cells are sensed at a hard bit reference level and test soft bit reference levels. The test soft bit reference levels are grouped around the hard bit reference level. A metric is determined for the test soft bit reference levels. Bins are defined based on the hard bit reference level and the set of test soft bit reference levels. A metric may be determined for each of the bins. The new soft bit reference levels are determined based on the metric. In one aspect, the metric is how many memory cells have a value for a physical parameter within each bin. The soft bit reference levels may be established based on a target percentage for the bins. In one aspect, the metric is how many unsatisfied counters are within each bin.

20 Claims, 23 Drawing Sheets

Sparse parity check matrix H

N=13 variable nodes

|  | v1 | v2 | v3 | v4 | v5 | v6 | v7 | v8 | v9 | v10 | v11 | v12 | v13 |
|---|---|---|---|---|---|---|---|---|---|---|---|---|---|
| cn1 |  | 1 |  | 1 |  |  |  |  |  |  | 1 |  | 1 |
| cn2 | 1 |  |  |  |  |  | 1 |  |  |  |  | 1 |  |
| cn3 |  |  | 1 |  | 1 | 1 |  |  | 1 | 1 |  |  |  |
| cn4 |  | 1 |  |  |  |  |  | 1 |  | 1 |  |  |  |
| cn5 |  |  |  |  |  | 1 |  | 1 |  |  |  | 1 |  |
| cn6 | 1 |  |  |  | 1 | 1 |  |  | 1 |  |  |  |  |
| cn7 |  | 1 |  |  |  |  |  | 1 |  | 1 |  |  | 1 |
| cn8 |  |  |  |  | 1 |  |  | 1 |  |  | 1 | 1 |  |
| cn9 | 1 |  | 1 |  | 1 |  |  |  |  |  |  |  | 1 |
| cn10 |  |  |  |  |  |  | 1 | 1 | 1 | 1 |  |  |  |

M=10 check nodes

Sparse bipartite graph, 392

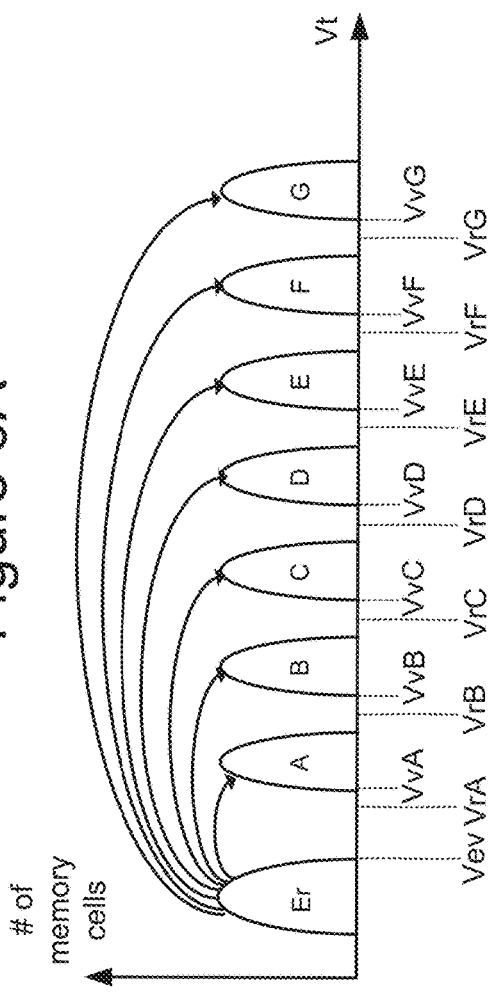
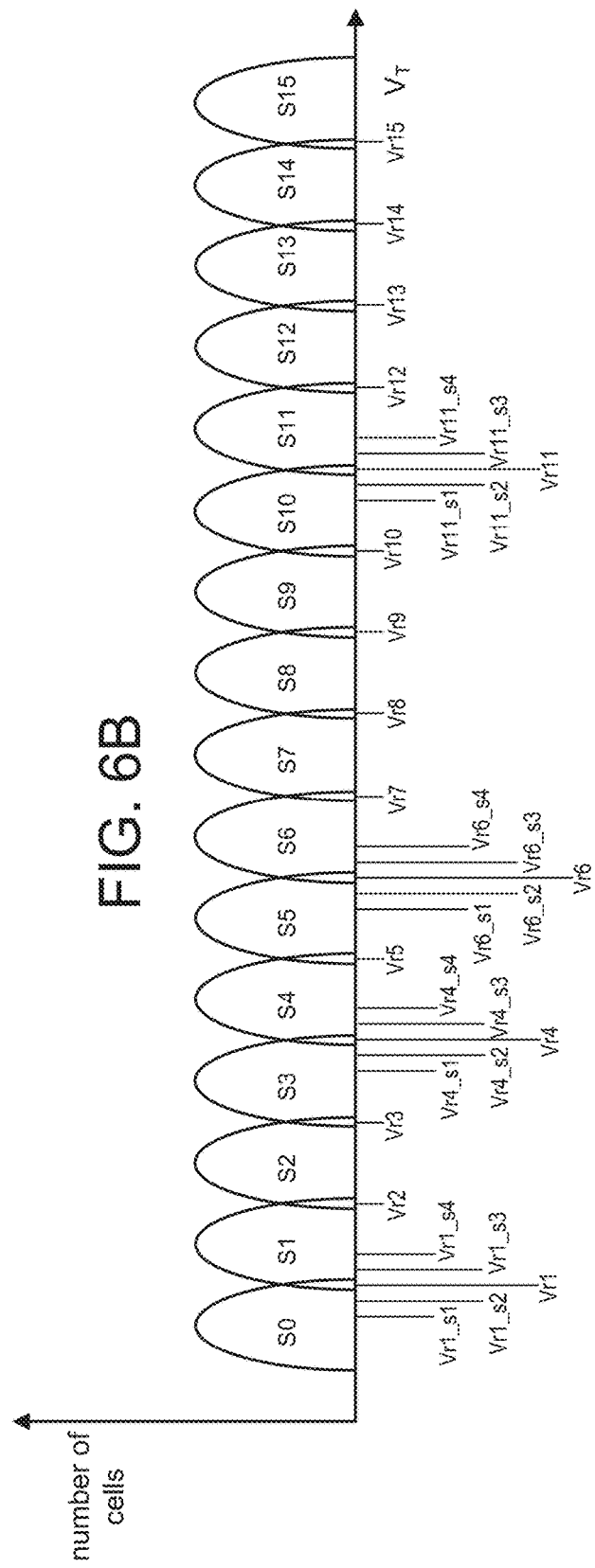

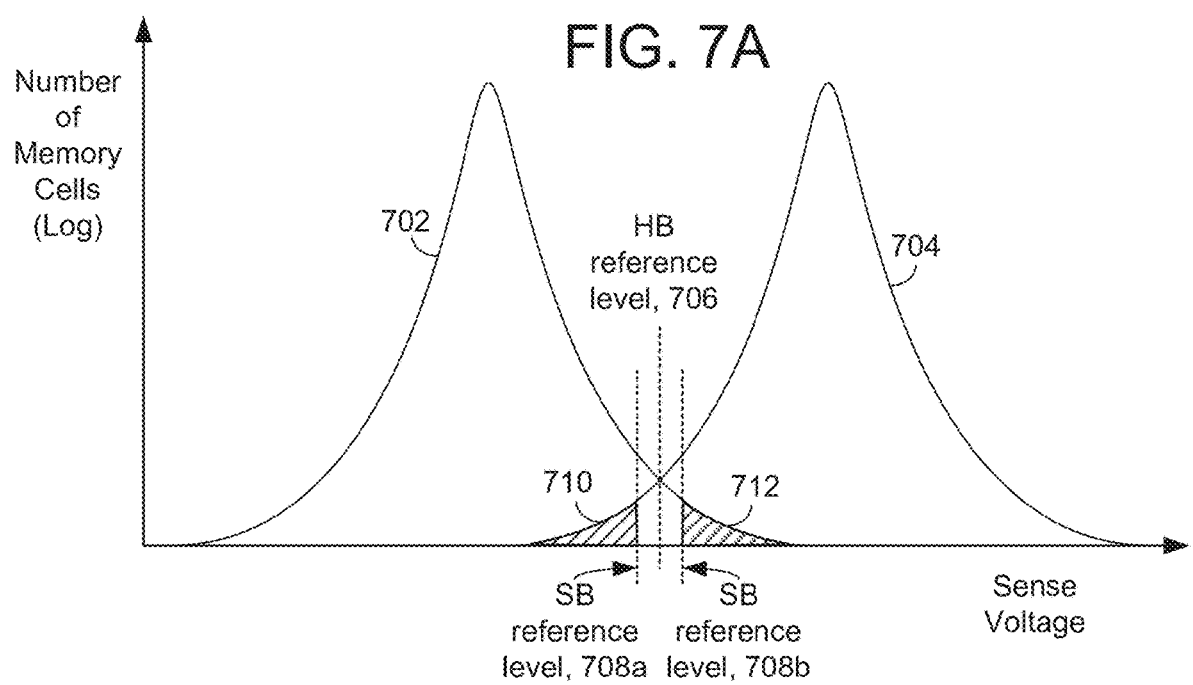
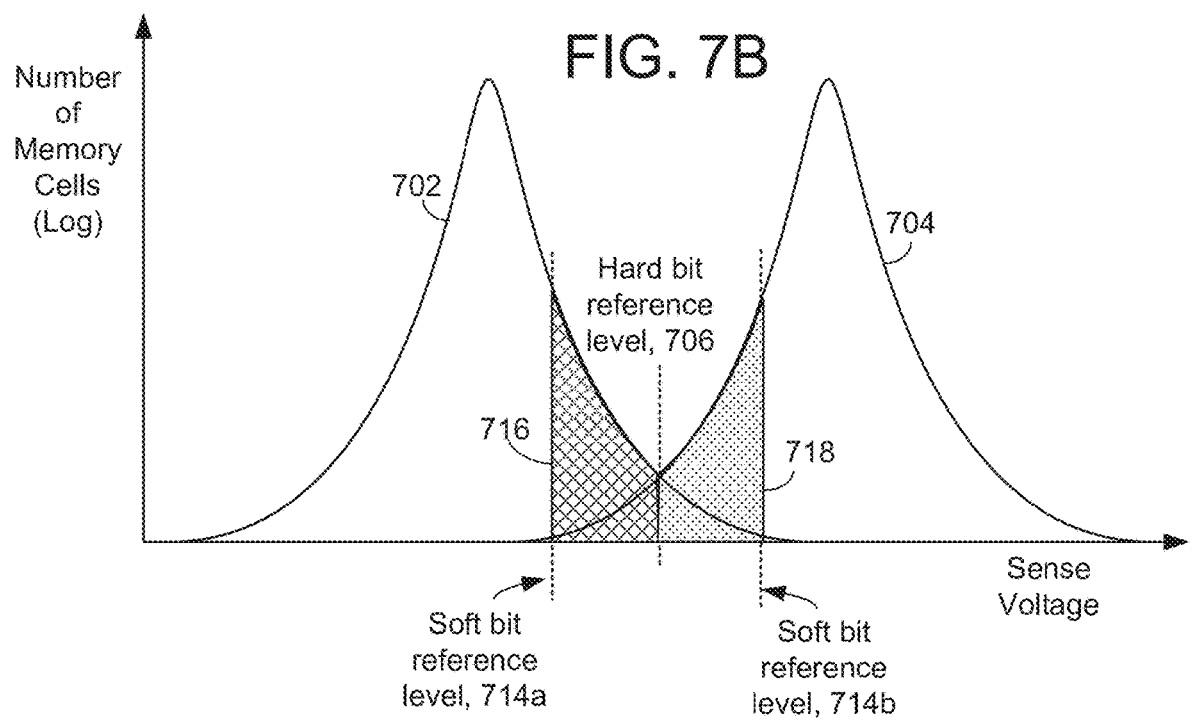

FIG. 12
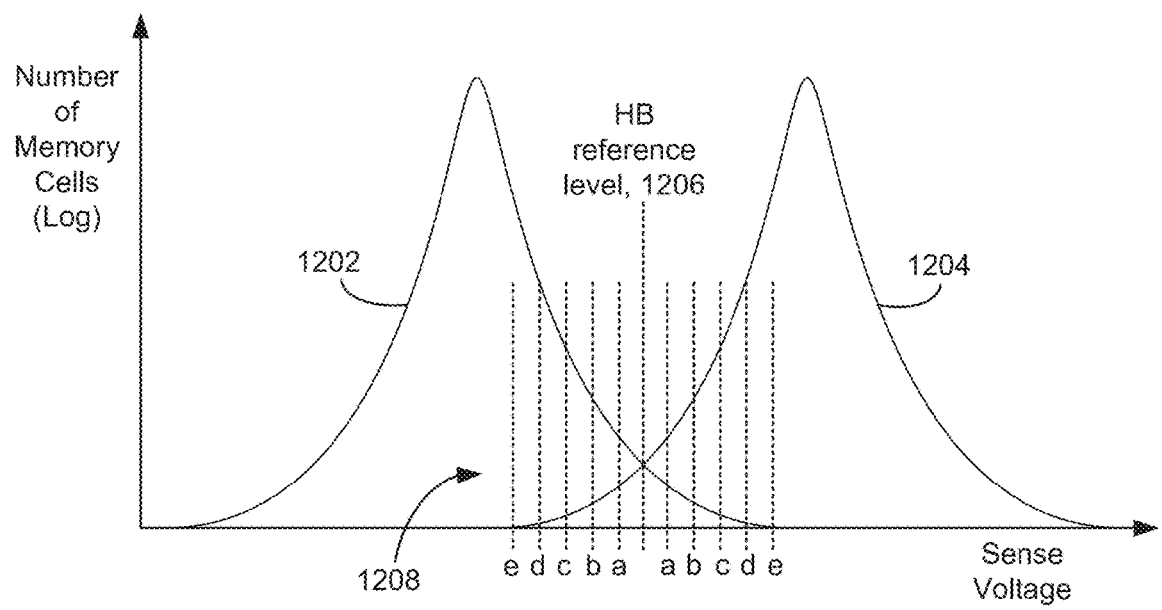
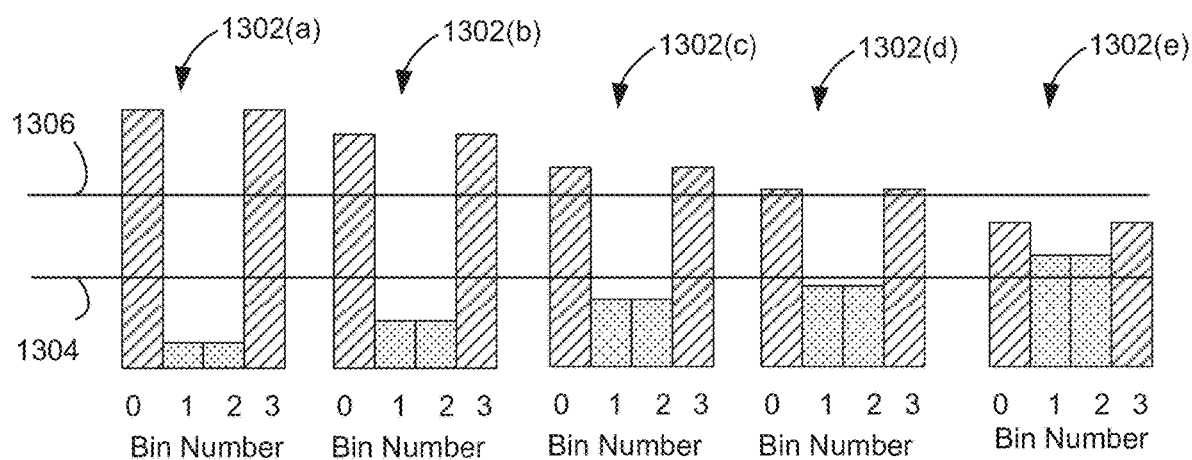
FIG. 13

1600

| HB / SB | Unsatisfied Counters | | | | | |
|---|---|---|---|---|---|---|
| | 0 | 1 | 2 | 3 | 4 | 5 |
| 0 1 | 3432 | 455 | 454 | 11 | 32 | 23 |
| 0 0 | 2354 | 1234 | 243 | 23 | 12 | 7 |
| 1 0 | 3464 | 987 | 243 | 12 | 23 | 23 |
| 1 1 | 3456 | 1232 | 243 | 123 | 3 | 11 |

FIG. 16

$$\tilde{\underline{E}}(\underline{C}) = \max_{\underline{E}} \Pr(\underline{C} \mid \underline{E}) = \max_{\underline{E}} \sum_{r=0}^{L-1} \sum_{q=0}^{d_v} C_r^q \cdot \log\left(\tilde{C}_r^q \mid \underline{E}\right) = \max_{\underline{E}} \sum_{r=0}^{L-1} \sum_{q=0}^{d_v} C_r^q \cdot \log\left(\left(P_{q|c}(\underline{E}) - P_{q|\bar{c}}(\underline{E})\right) \cdot E_r + P_{q|\bar{c}}(\underline{E}) \cdot C_r\right)$$

FIG. 17A

$$P_{q|c}(\underline{E}) = \binom{d_v}{q} \cdot p_{u|c}^q \cdot (1 - p_{u|c})^{d_v - q} = \binom{d_v}{q} \left(\frac{1}{2} + \frac{1}{2} \cdot \left(1 - \frac{2}{N} \cdot \sum_{r=1}^{L-1} E_r\right)^{d_c - 1}\right)^q \cdot \left(\frac{1}{2} - \frac{1}{2} \cdot \left(1 - \frac{2}{N} \cdot \sum_{r=1}^{L-1} E_r\right)^{d_c - 1}\right)^{d_v - q}$$

FIG. 17B

$$P_{q|\bar{c}}(\underline{E}) = \binom{d_v}{q} \cdot p_{u|\bar{c}}^q \cdot (1 - p_{u|\bar{c}})^{d_v - q} = \binom{d_v}{q} \left(\frac{1}{2} - \frac{1}{2} \cdot \left(1 - \frac{2}{N} \cdot \sum_{r=1}^{L-1} E_r\right)^{d_c - 1}\right)^q \cdot \left(\frac{1}{2} + \frac{1}{2} \cdot \left(1 - \frac{2}{N} \cdot \sum_{r=1}^{L-1} E_r\right)^{d_c - 1}\right)^{d_v - q}$$

FIG. 17C

$$p_{y|x} = \begin{bmatrix} E_1 / p_0 & E_2 / p_0 & (C_3 - E_3) / p_0 & (C_3 - E_3) / p_0 \\ (C_1 - E_1) / p_1 & (C_2 - E_2) / p_1 & E_3 / p_1 & E_4 / p_1 \end{bmatrix}, \quad p_x = [0.5 \quad 0.5]$$

where $$p_0 = E_1 + E_2 + (C3 - E_3) + (C_4 - E_4), \quad p_1 = E_1 + E_2 + (C3 - E_3) + (C_4 - E_4)$$

FIG. 17D

Perform N soft bit reads to generate N soft bits per memory cell
1902

Emulate soft bit reads based on the N soft bits to generate N^2 soft bits
1904

Determine a metric for the bins based on emulated soft bits (and the soft bits that were read)
1906

SOFT BIT REFERENCE LEVEL CALIBRATION

CLAIM OF PRIORITY

The present application claims priority from U.S. Provisional Patent Application No. 63/065,229, entitled "SOFT BIT REFERENCE LEVEL CALIBRATION," by Zamir et al., filed Aug. 13, 2020, incorporated by reference herein in its entirety.

BACKGROUND

The strong growth in demand for portable consumer electronic devices is driving the need for high-capacity storage devices. Non-volatile semiconductor memory devices (also referred to herein as "non-volatile memory systems"), such as flash memory storage cards, are widely used to meet the ever-growing demands on digital information storage and exchange. Their portability, versatility and rugged design, along with their high reliability and large capacity, have made such memory devices ideal for use in a wide variety of host electronic devices, including for example digital cameras, digital music players, video game consoles, PDAs, cellular telephones, desktop computers, laptop computers, and notepad computers. Typically, the host electronic devices provides power to the non-volatile memory system.

Storing multiple bits of information in a single non-volatile memory cell typically includes mapping sequences of bits to states of the non-volatile memory cell. For example, a first sequence of bits "110" may correspond to a first state of a non-volatile memory cell and a second sequence of bits "010" may correspond to a second state of the non-volatile memory cell. After determining that a sequence of bits is to be stored into a particular non-volatile memory cell, the non-volatile memory cell may be programmed to a state that corresponds to the sequence of bits.

Once the memory cells in the memory device have been programmed, data may be read from the memory cells by sensing the programming states of the memory cells. In one technique, the memory cells are sensed at one or more "hard bit reference levels." A hard bit reference level is used to distinguish between two of the states. However, sensed states can sometimes vary from the written programed states due to one or more factors. Error correction decoding can be used to correct data errors resulting from sensed states that do not match written programed states. Some error correction decoding makes use of only "hard bits," which are derived from sensing at the hard bit reference levels.

Improved error correction capability may be achieved by decoding data using soft bits. Soft bits are derived from sensing the memory cells at a set of "soft bit reference levels." Soft bits can indicate reliability of a hard bit for each memory cell. To illustrate, soft bits may be used with ECC (Error Correcting Codes) decoding to enhance error correction capability in non-volatile memory systems that may experience memory cell errors and internal transmission errors. For example, improved error correction capability may be achieved by using low-density parity-check (LDPC) codes, and including soft bit values, as inputs to a decoder as compared to a decoding scheme that is based on using hard bits only.

DESCRIPTION OF THE DRAWINGS

Like-numbered elements refer to common components in the different Figures.

FIG. 6A illustrates example threshold voltage distributions for the memory array when each memory cell stores three bits of data.

FIG. 6B depicts threshold voltage distributions in which each memory cell stores four bits of data.

FIG. 7A depicts an example in which the soft-bit thresholds might be set too close to the hard bit threshold.

FIG. 7B depicts an example in which the soft-bit thresholds might be set too far from the hard bit threshold.

FIG. 12 depicts two memory cell distributions in order to discuss an example of test SB reference levels.

FIG. 13 depicts an example of counts for each of four bins for an example that corresponds to levels a-e in FIG. 12.

FIG. 16 depicts an embodiment of a table used to summarize unsatisfied counters by bins.

FIGS. 17A-17D depict equations used when calculating mutual information for calibrating soft bit reference levels, in accordance with one embodiment.

DETAILED DESCRIPTION

Figure 1A:
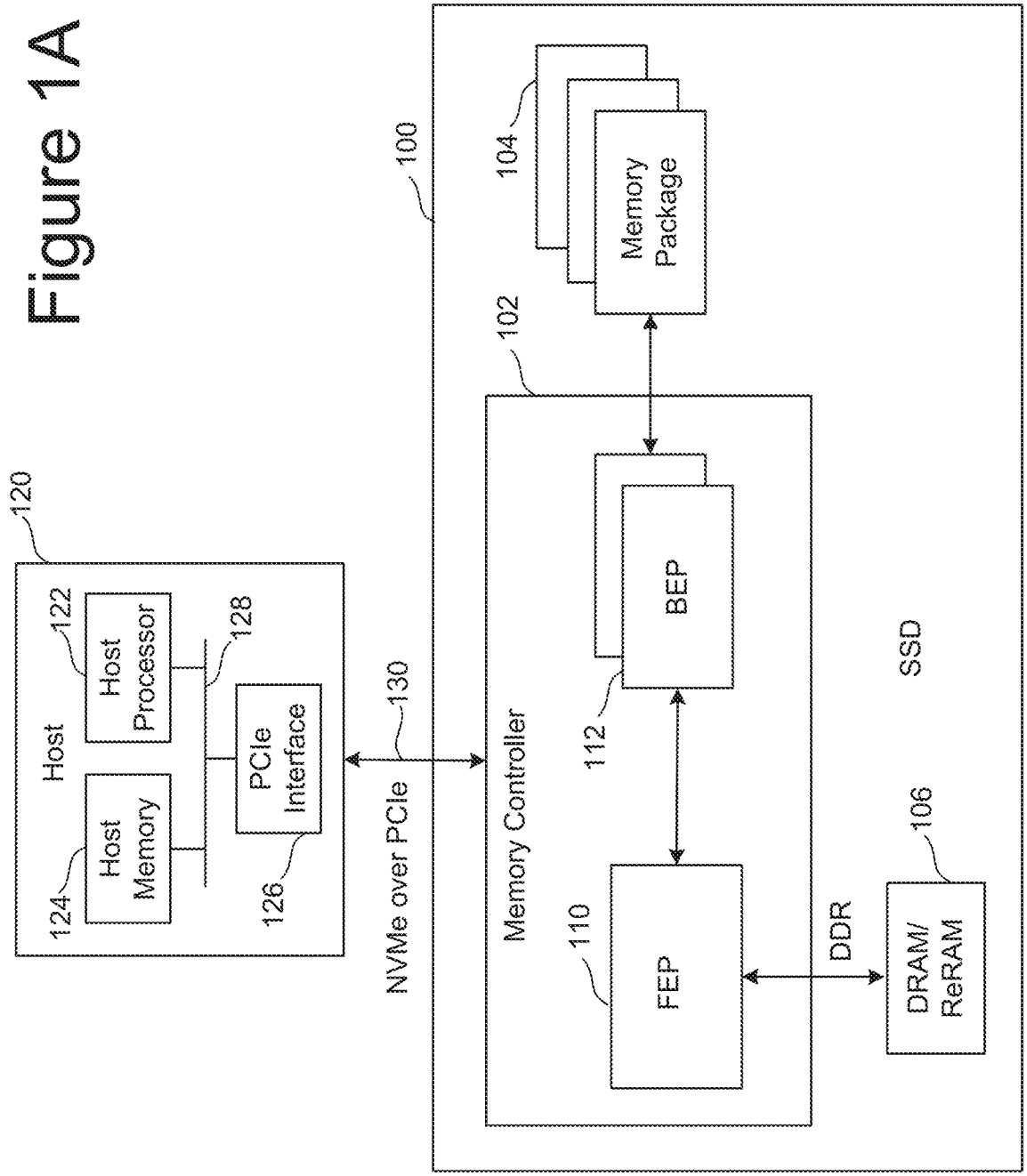
FIG. 1A is a block diagram of one embodiment of a memory system connected to a host.

The present technology will now be described with reference to the figures, which in embodiments, relate to calibration of soft bit reference levels in a non-volatile memory system. Calibrating the soft bit reference levels improves the quality of the soft bits derived from sensing non-volatile memory cells at the soft bit reference levels. Therefore, error correction based on the soft bits is improved.

In one embodiment, a set of non-volatile memory cells are sensed at a hard bit reference level and a set of test soft bit reference levels. The test soft bit reference levels are grouped around the hard bit reference level, but are not necessarily the soft bit reference levels used to read and decode data from the memory cells. A metric is determined for the test soft bit reference levels. In one embodiment, bins are defined based on the hard bit reference level and the set of test soft bit reference levels. A metric may be determined for each of the bins. The new soft bit reference levels are determined based on the metric.

In one embodiment, the metric is how many memory cells have a value for a physical parameter (e.g., threshold voltage, resistance) within each bin. In one embodiment, new soft bit reference levels are established based on a target percentage for the bins. In one embodiment, the metric is how many unsatisfied counters are within each bin. The unsatisfied counters are related to the syndrome weight, which is the number of unsatisfied check nodes (check nodes could also be referred to as parity check equations). The unsatisfied counter for a particular bit in a codeword is the number unsatisfied check nodes to which the bit is connected. In one embodiment, mutual information is determined based on the unsatisfied counters. The mutual information is between data programmed into the memory cells and data read from the memory cells. In one embodiment, the soft bit reference levels are selected to maximize the mutual information.

In some embodiments, the semiconductor die controls memory operations at a chip level. In some embodiments, the semiconductor die contains the non-volatile memory cells upon which the memory operation is performed, as well as control circuitry that controls the memory operation at the chip level. In some embodiments, the semiconductor die is configured to be connected to the non-volatile memory cells upon which the memory operation is performed. For example, there may be one semiconductor die that contains a memory structure having non-volatile memory cells (referred to herein as a "memory structure die"), and another semiconductor die that contains control circuitry (referred to herein as a "control die") that controls the memory operations on memory structure die. In some embodiments, the control die is bonded to the memory structure die.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

FIG. 1A-FIG. 3C and FIGS. 4A-4B describe one example of a memory system that can be used to implement the technology disclosed herein.

FIG. 1A is a block diagram of one embodiment of a memory system 100 connected to a host 120. Memory system 100 can implement the technology disclosed herein. Many different types of memory systems can be used with the technology disclosed herein. One example memory system is a solid state drive ("SSD"); however, other types of memory systems can also be used. Memory system 100 comprises a memory controller 102, memory package 104 for storing data, and local memory (e.g. DRAM/ReRAM) 106. Memory controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the memory controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the integrated memory assemblies/die at the request of FEP circuit 110. In some embodiments, an integrated memory assembly is referred to as a memory package. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 is one example of a control circuit. The term apparatus may be used herein to refer to any of, but not limited to, memory package 104, memory system 100, memory controller 102, or the combination of memory system 100 and host 120.

In one embodiment, there are a plurality of memory package 104. Each memory package 104 may contain one or more memory dies. In one embodiment, each memory die in the memory package 104 utilize NAND flash memory (including two dimensional NAND flash memory and/or three dimensional NAND flash memory). In other embodiments, the memory package 104 can include other types of memory; for example, the memory package can include Phase Change Memory (PCM) memory.

Memory controller 102 communicates with host 120 using an interface 130 that implements NVM Express (NVMe) over PCI Express (PCIe). For working with memory system 100, host 120 includes a host processor 122, host memory 124, and a PCIe interface 126, which communicate over bus 128. Host memory 124 is the host's physical memory, and can be DRAM, SRAM, non-volatile memory or another type of storage. Host 120 is external to and separate from memory system 100. In one embodiment, memory system 100 is embedded in host 120.

Figure 1B:
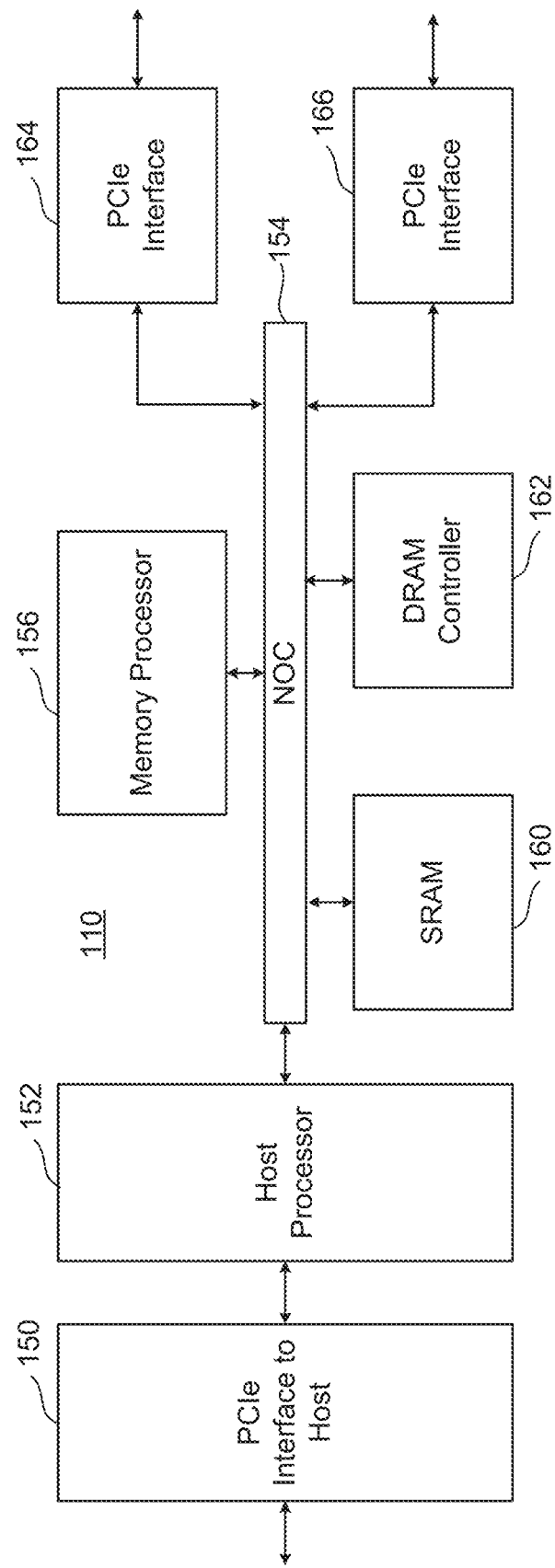
FIG. 1B is a block diagram of one embodiment of a Front End Processor Circuit.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, memory controller 102 includes two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 2A:
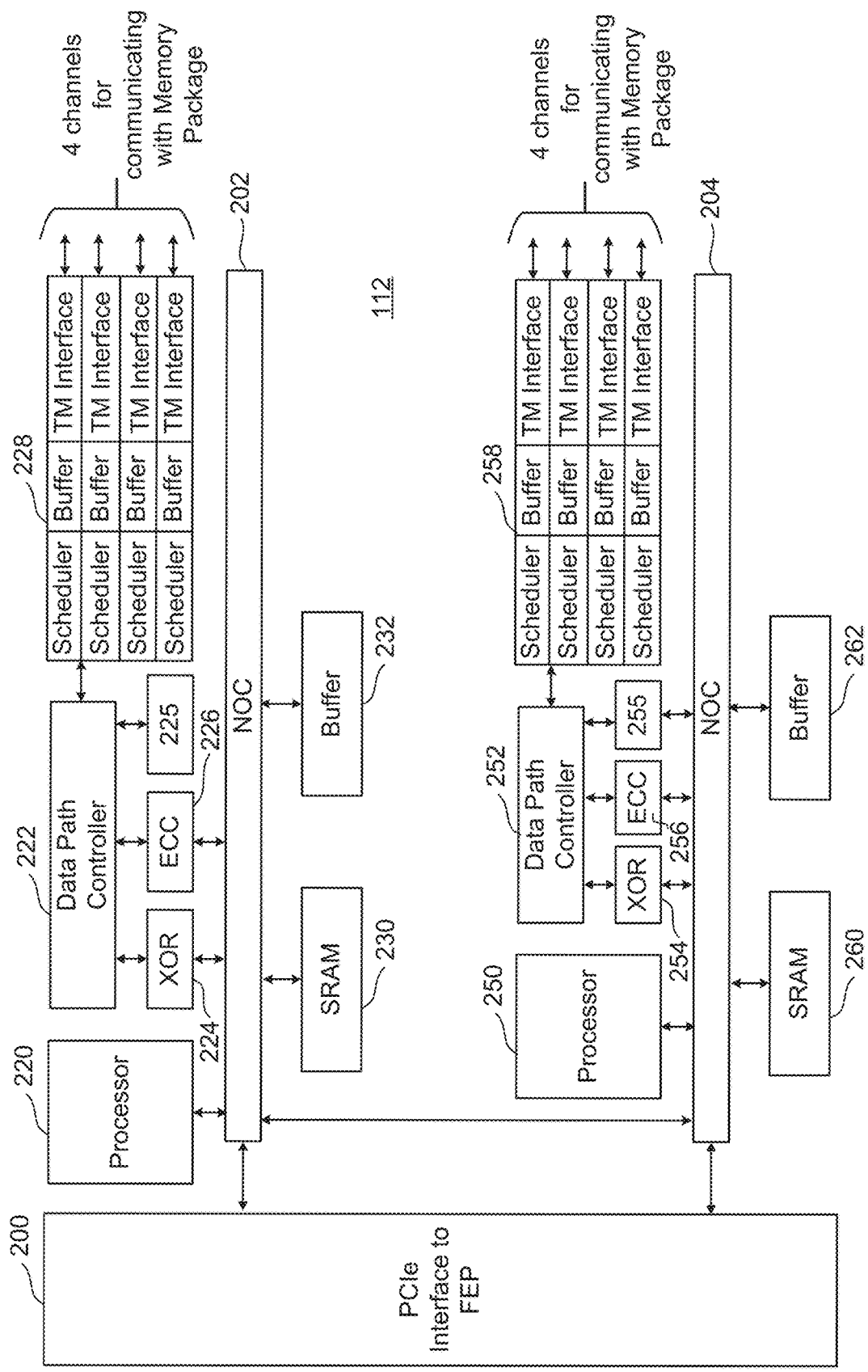
FIG. 2A is a block diagram of one embodiment of a Back End Processor Circuit.

FIG. 2A is a block diagram of one embodiment of the BEP circuit 112. FIG. 2A shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256), and a read reference voltage calibration engine (225/255). In one embodiment, the read reference voltage calibration engine (225/255) is configured to calibrate soft bit reference voltages. The read reference voltage calibration engine may also calibrate hard bit reference voltages.

The ECC engines 226/256 are used to perform error correction, as known in the art. Herein, the ECC engines 226/256 may be referred to as controller ECC engines. The XOR engines 224/254 are used to XOR the data so that data can be combined and stored in a manner that can be recovered in case there is a programming error.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254, ECC engines 226/256, and read reference voltage calibration engines (225/255) are dedicated hardware circuits, known as hardware accelerators. In other embodiments, the XOR engines 224/254, ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 2A. Additionally, controllers with structures different than FIGS. 1B and 2A can also be used with the technology described herein.

Figure 2B:
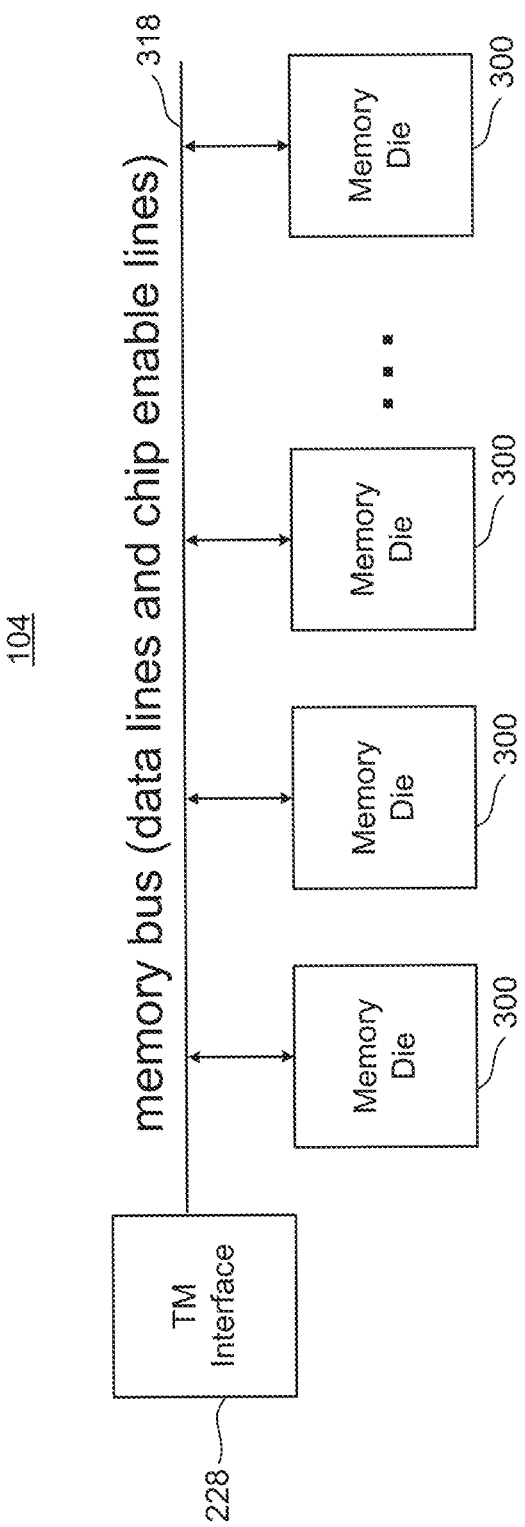
FIG. 2B is a block diagram of one embodiment of a memory package.

FIG. 2B is a block diagram of one embodiment of a memory package 104 that includes a plurality of memory die 300 connected to a memory bus (data lines and chip enable lines) 322. The memory bus 322 connects to a Toggle Mode Interface 228 for communicating with the TM Interface of a BEP circuit 112 (see e.g., FIG. 2A). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Figure 3A:
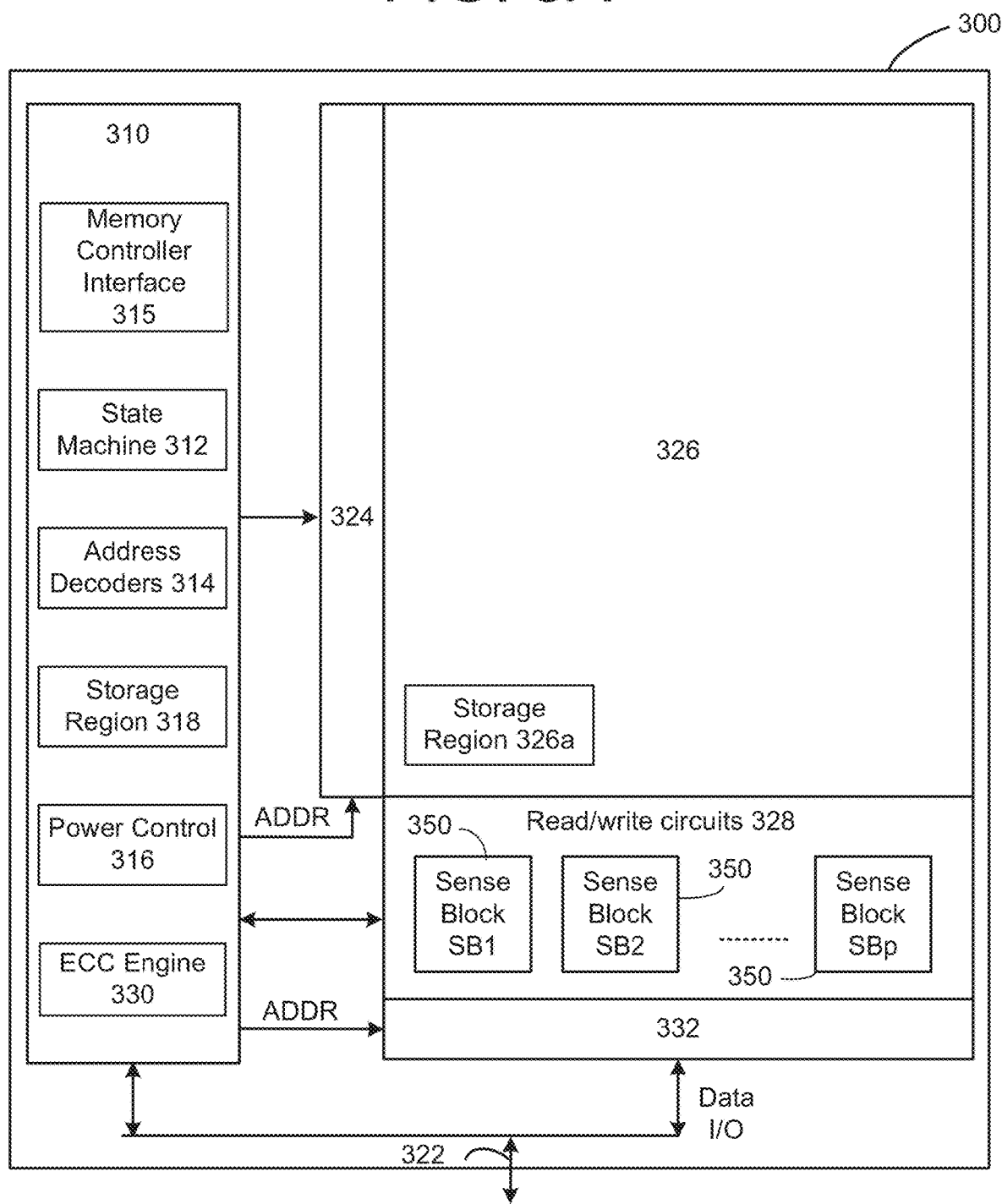
FIG. 3A is a functional block diagram of an embodiment of a memory die.

FIG. 3A is a functional block diagram of one embodiment of a memory die 300. Each of the one or more memory die 300 of FIG. 2B can be implemented as memory die 300 of FIG. 3A. The components depicted in FIG. 3A are electrical circuits. In one embodiment, each memory die 300 includes a memory structure 326, control circuitry 310, read/write circuits 328, and decoders 324/332, all of which are electrical circuits. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed in parallel. In one embodiment, each sense block include a sense amplifier and a set of latches connected to the bit line. The latches store data to be written and/or data that has been read. The sense blocks include bit line drivers.

Commands and data are transferred between the controller 102 and the memory die 300 via memory controller interface 315. Memory controller interface 315 is an electrical interface for communicating with memory controller 102. Examples of memory controller interface 315 include a Toggle Mode Interface and an Open NAND Flash Interface (ONFI). Other I/O interfaces can also be used. For example, memory controller interface 315 may implement a Toggle Mode Interface that connects to the Toggle Mode interfaces of memory interface 228/258 for memory controller 102. In one embodiment, memory controller interface 315 includes a set of input and/or output (I/O) pins that connect to communication channel 322 (also refers to herein as a data bus). In one embodiment, communication channel 322 connects to the memory controller 102 as part of the Toggle Mode Interface.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control module 316, a memory controller interface 315, storage region 318, and ECC engine 330. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuitry 310 includes buffers such as registers, ROM fuses and other storage devices for storing default values such as base voltages and other parameters. The default values and other parameters could be stored in a region of the memory structure 326 (e.g., structure parameter storage 326a).

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages.

Storage region 318 may be used to store parameters for operating the memory structure 326. Storage region 318 may include volatile or non-volatile memory. In some embodiments, the parameters include soft bit reference levels. The parameters may also include hard bit reference levels. The memory structure 326 has storage region 326a, which may also contain a copy of the parameters for operating the memory structure 326. In some embodiments, the parameters are copied from storage region 326a to storage region 318 when the memory die 300 is powered on.

For purposes of this document, control circuitry 310, alone or in combination with read/write circuits 328 and decoders 324/332, comprise one or more control circuits connected to memory structure 326. This one or more control circuits are an electrical circuit that performs the functions described below in the flow charts. In other embodiments, the one or more control circuits can consist only of controller 102 (or other controller), which is an electrical circuit in combination with software (e.g., firmware), that performs the functions described below in the flow charts. In one embodiment, the one or more control circuits is the controller where the controller is an electrical circuit that does not use hardware. In another alternative, the one or more control circuits comprises controller 102 and control circuitry 310 performing the functions described below in the flow charts. In another embodiment, the one or more control circuits comprises state machine 312 (and/or a microcontroller and/or microprocessor) alone or in combination with controller 102. In another alternative, the one or more control circuits comprises controller 102, control circuitry 310, read/write circuits 328 and decoders 324/332 performing the functions described below in the flow charts. In other embodiments, the one or more control circuits comprises one or more electrical circuits that operate the non-volatile memory. The term apparatus as used herein may include, but is not limited to, memory die 300, memory package 104, storage device 100, or a host system 120 that includes a storage device 100.

In one embodiment, memory structure 326 comprises a monolithic three-dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A storage device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a Ge$_2$Sb$_2$Te$_5$ alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

Figure 3B:
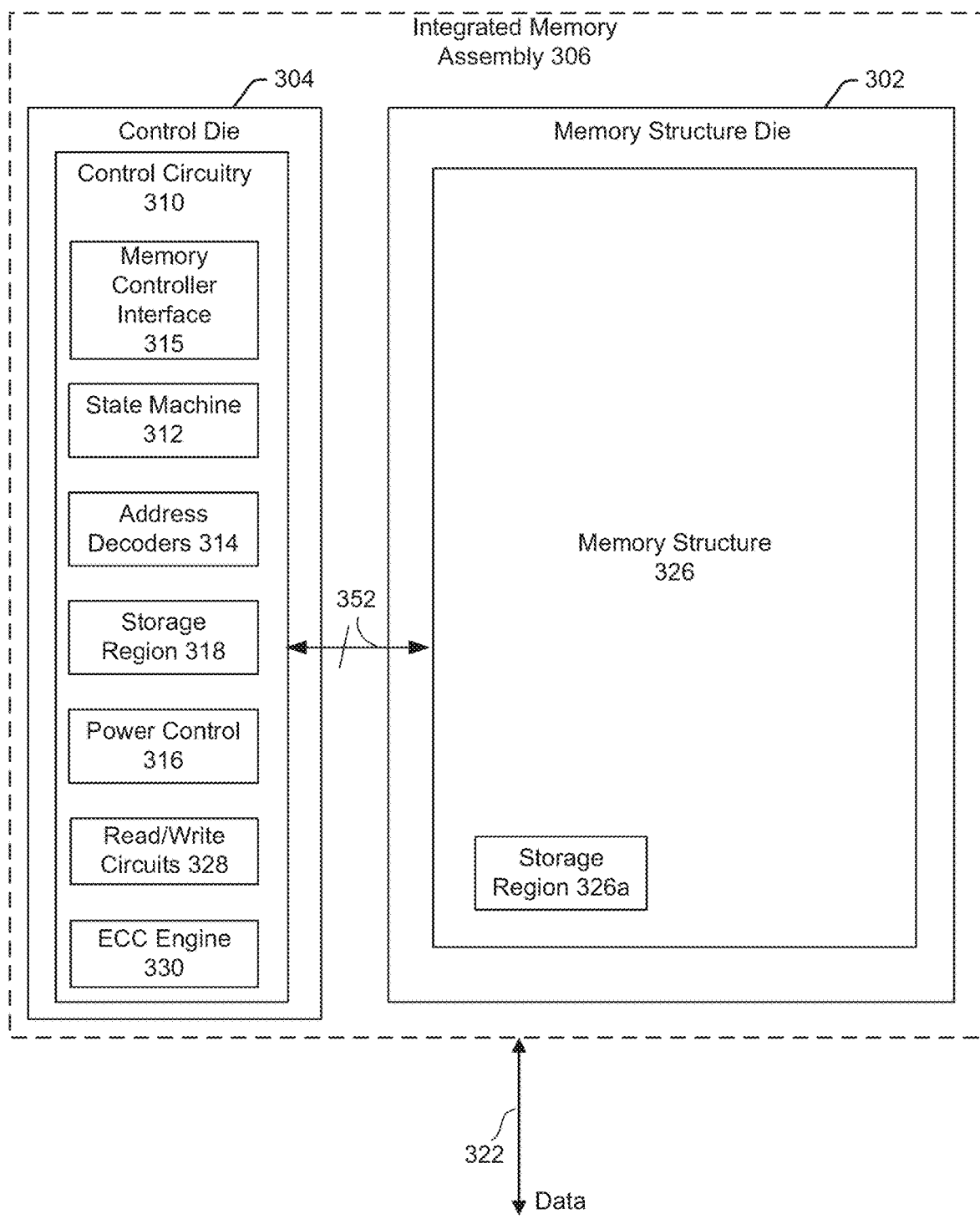
FIG. 3B is a functional block diagram of an embodiment of an integrated memory assembly.

FIG. 3B depicts a functional block diagram of one embodiment of an integrated memory assembly 306. The integrated memory assembly 306 may be used in a memory package 104 in memory system 100. In one embodiment, the integrated memory assembly 306 includes two types of semiconductor die (or more succinctly, "die"). Memory structure die 302 includes include memory structure 326. Memory structure 326 may contain non-volatile memory cells. Control die 304 includes control circuitry 310. In some embodiments, the control die 304 is configured to connect to the memory structure 326 in the memory structure die 302. For example, the control circuitry 310 is configured to be connected to non-volatile memory cells in memory structure 326 in memory structure die 302. In some embodiments, the memory structure die 302 and the control die 304 are bonded together. The control circuitry 310 includes state machine 312, an address decoder 314, a power control circuit 316, memory controller interface 315, storage region 318, and ECC engine 330. The control circuitry 310 also includes read/write circuits 328. In another embodiment, a portion of the read/write circuits 328 are located on control die 304, and a portion of the read/write circuits 328 are located on memory structure die 302.

Any subset of components in the control circuitry 310 of control die 304 can be considered one or more control circuits. In another alternative, the one or more control circuits comprises controller 102 and control circuitry 310 of control die 304 performing the functions described below in the flow charts. The one or more control circuits can include hardware only or a combination of hardware and software (including firmware). For example, a controller programmed by firmware is one example of a control circuit. One or more control circuits can include a processor, PGA (Programmable Gate Array, FPGA (Field Programmable Gate Array), ASIC (Application Specific Integrated Circuit), integrated circuit or other type of circuit.

Pathways 352 are pathways between one or more components in the control circuitry 310 and the memory structure on memory structure die 302. A pathway may be used to provide or receive a signal (e.g., voltage, current). A pathway includes an electrically conductive path. A pathway may include one or more of, but is not limited to, a bond pad, metal interconnect, via, transistor, electrically conducting material and other material that may transfer or carry an electrical signal.

In one embodiment, integrated memory assembly 306 includes a set of input and/or output (I/O) pins that connect to communication channel 322 (also refers to herein as a data bus). Communication channel 322 is depicted as being connected to integrated memory assembly 306 for generality. Communication channel 322 may connect to either or both of die 302 and/or 304. In one embodiment, communication channel 322 connect the memory controller 102 directly to control die 304.

Figure 3C:
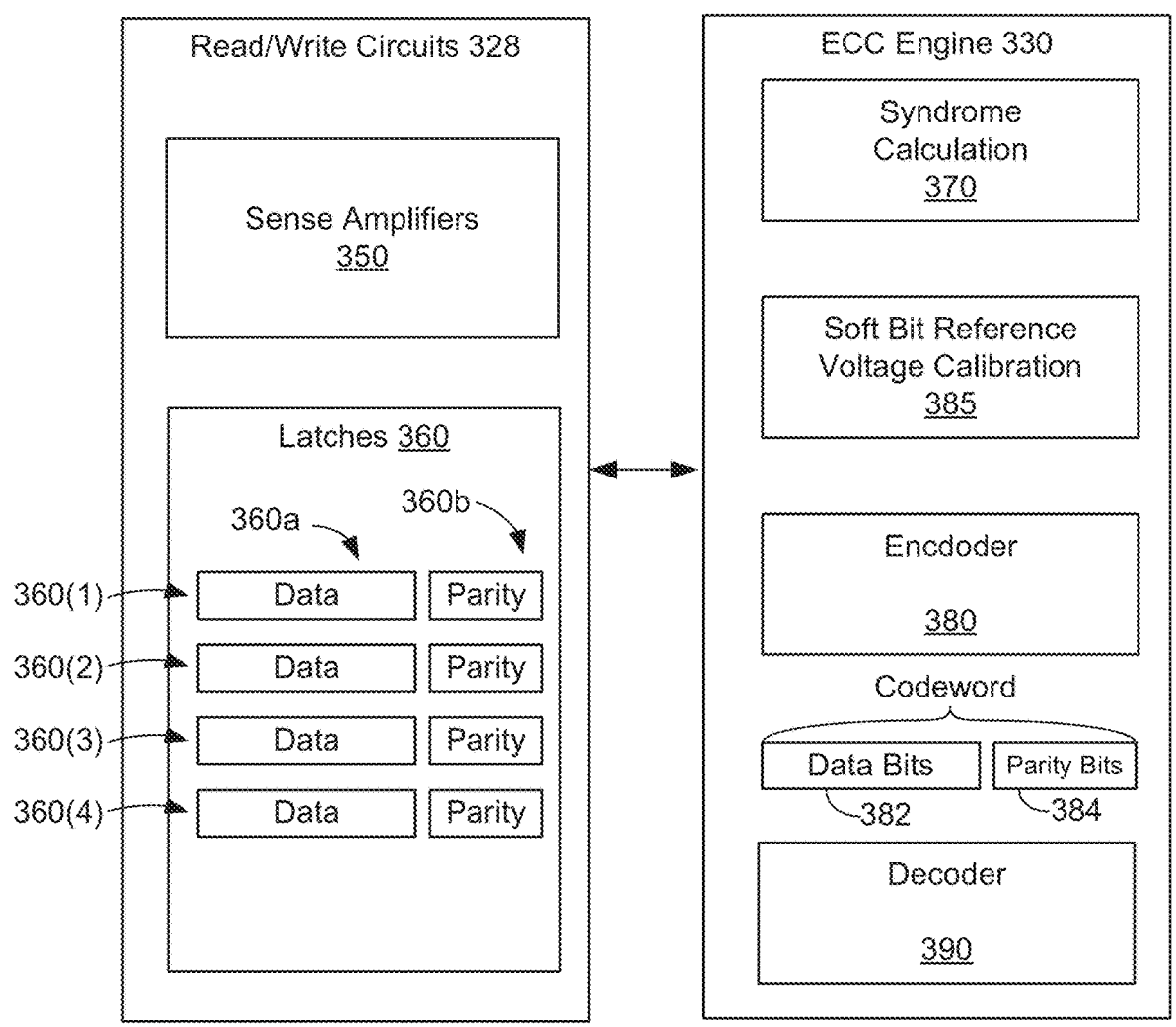
FIG. 3C is a block diagram of one embodiment of a read/write circuits and ECC of an integrated memory assembly.

FIG. 3C is a block diagram of one embodiment of the read/write circuits 328 and ECC engine 330 of the control die 304. The read/write circuits 328 have sense amplifiers 350 and latches 360. The latches 360 may include data latches 360a and parity latches 360b. In one embodiment, the data latches 360a store data bits of the codeword and the parity latches store parity bits of the codeword. It is not required that there be specific latches for data bits and for parity bits. FIG. 3C depicts four sets of data latches 360(1), 360(2), 360(3), 360(4). Each set may be used to store a codeword for a different page. In an embodiment in which four bits are stored per memory cell, four pages are stored in a set of memory cells. The four pages may be referred to as a lower page (LP), lower-middle page (LMP), upper-middle page (UMP), and an upper page (UP). In another embodiment, the sense amplifiers 350 are on the memory structure die 302, but the latches 360 are on the control die 304.

The on-die ECC engine 330 is able to encode data bits received from the memory controller 102. In one embodiment, the on-die ECC engine 330 forms codewords that each contain data bits and parity bits. In one embodiment, the memory controller 102 provides the codewords to the control die 304. The control circuitry 310 stores the codewords into non-volatile memory cells in the memory structure 326. Upon a request from the memory controller 102 to read data, the control circuitry 310 reads codewords from the memory structure 326. The on-die ECC engine 330 is also able to decode and error correct the codewords read from the memory structure 326. In some embodiments, the on-die ECC engine 330 calculates parity bits for each unit of data (e.g., page) that is being stored. The parity bits (also referred to as an error correction code) may be stored with the unit of data (e.g., page). The combination of the unit of data and its associated parity bits are referred to as a codeword. In one embodiment, the parity bits are stored remotely from the unit of data (e.g., page).

The on die ECC engine 330 includes syndrome calculation logic 370, an encoder 380, a decoder 390, and soft bit reference voltage calibration 385. The encoder 380 is configured to encode data using an ECC scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The encoder 380 may form a codeword, which contains data bits 382 and parity bits 384. The data bits may be provided by the memory controller 102.

In one embodiment, the data bits 382 are stored in the data latches 360a, and the parity bits 384 are stored in the parity latches 360b. Based on the bits in the latches 360, the sense amplifiers 350 may control bit line voltages in the memory structure 326 when the non-volatile memory cells are being programmed. In this manner, the codewords may be programmed into non-volatile memory cells in the memory structure 326. It will be appreciated that other voltages may also be applied to the memory structure 326, such applying a program voltage to memory cells that are selected for programming.

The decoder 390 is configured to decode the codewords that were stored in the memory structure die 302. In one embodiment, sense amplifiers 350 sense bit lines in the memory structure 326 in order to read a codeword. The sense amplifiers 350 may store the read codeword into latches 360. The decoder 390 is able to detect and correct errors in the codeword. In one embodiment, the decoder 390 is a relatively low power decoder, as compared to a decoder on the memory controller 102. In one embodiment, the decoder on the memory controller 102 is able to correct more bit errors in the codeword than can typically be corrected by decoder 390. Thus, decoder 390 may provide a power versus error correction capability tradeoff. For example, decoder 390 may be very efficient with respect to power consumption, but at the expense of possibly not being able to correct a high number of errors in a codeword.

In one embodiment, the decoder 390 implements a hard bit decoder. In one embodiment, the decoder 390 implements a soft bit decoder. The decoder 390 may implement both a hard bit decoder and a soft bit decoder. For example, the control die 304 may first attempt to decode a codeword with the hard bit decoder. If that fails, then the control die 304 may attempt to decode using the soft bit decoder.

In some embodiments, the decoder 390 is based on a sparse bipartite graph having bit (or variable) nodes and check nodes. The decoder 390 may pass messages between the bit nodes and the check nodes. Passing a message between a bit node and a check node is accomplished by performing a message passing computation, in some embodiments. The message passing computation may be based on believe propagation.

The syndrome calculation logic 370 is able to determine a syndrome weight for codewords. The syndrome weight refers to the number of parity check equations that are unsatisfied. Parity check equations are discussed in more detail in connection with FIGS. 3D and 3E. The initial syndrome weight of a codeword may correlate with the bit error rate (BER) of that codeword. Thus, the control die 304 may estimate a BER for a codeword based on the initial syndrome weight. In one embodiment, the syndrome calculation logic 370 is implemented in hardware. The syndrome weight can be determined without fully decoding a codeword. Hence, the initial syndrome weight can be calculated in less time and with less power than for decoding a codeword. In some embodiments, the control die 304 makes management decisions based on the initial syndrome weight. For example, the control die 304 may calibrate soft bit reference voltages based on the syndrome weight. In one embodiment, the control die 304 calibrates soft bit reference voltages based on the BER.

The soft bit reference voltage calibration 385 is configured to determine new soft bit reference voltages for reading memory cells in the memory structure 326. The soft bit reference voltage calibration 385 may use one or more different techniques to determine the new read reference voltages. By the control die 304 determining the new soft bit reference levels (in many cases), the memory controller 102 is substantially less burdened with such tasks.

Figures 3D, 3E:
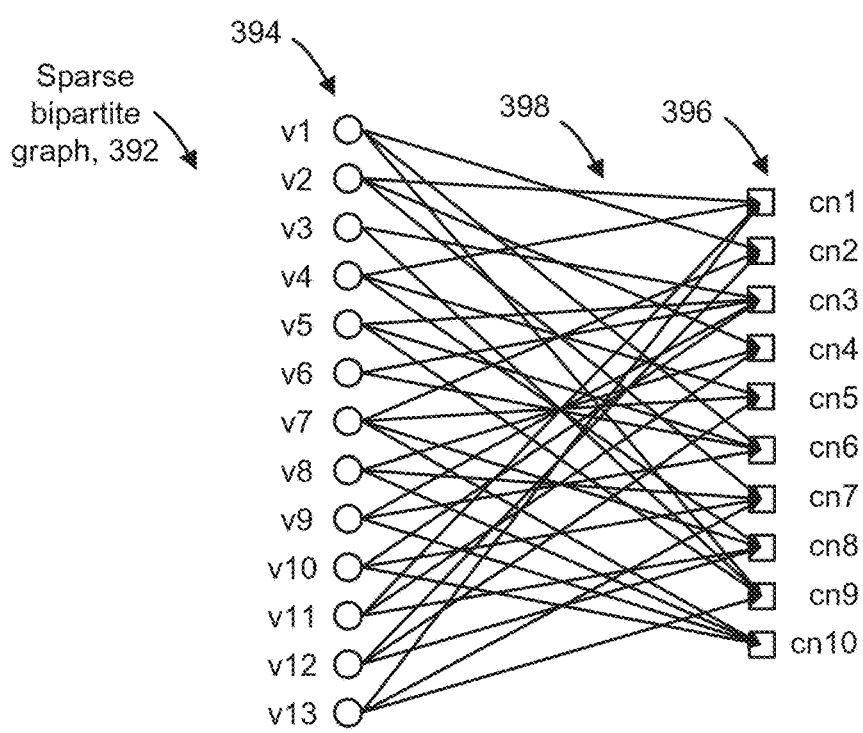
FIG. 3D depicts an example of a sparse parity check matrix H.
FIG. 3E depicts a sparse bipartite graph which corresponds to the sparse parity check matrix of FIG. 3D.

As noted above, in some embodiments, the on-die ECC engine 330 uses a sparse parity check matrix. FIG. 3D depicts an example of a sparse parity check matrix H (which may also be represented as a sparse bipartite graph). The matrix includes M rows and K+M columns, which are in correspondence with K information bits and M parity bits in each codeword of length N=K+M. Further, the parity bits are defined such that M parity check equations are satisfied, where each row of the matrix represents a parity check equation.

FIG. 3E depicts a sparse bipartite graph 392 which corresponds to the sparse parity check matrix of FIG. 3D. Specifically, the code can be defined by a sparse bipartite graph G=(V,C,E) with a set V of N bit nodes 394 (N=13 in this example), a set C of M check nodes 396 (M=10 in this example) and a set E (E=38 in this example) of edges 398 connecting bit nodes 394 to check nodes 396. The bit nodes correspond to the codeword bits and the check nodes correspond to parity-check constraints on the bits. A bit node 394 is connected by edges 398 to the check nodes 396 it participates in.

During decoding, one embodiment of the decoder 390 attempts to satisfy the parity checks. In this example, there are ten parity checks, as indicated by the check nodes cn1 through cn10. The first parity check at cn1 determines if $v2 \oplus v4 \oplus v11 \oplus v13=0$, where "$\oplus$" denotes the exclusive-or (XOR) logical operation. This check is satisfied if there is an even number of "1" in bits corresponding to variable nodes v2, v4, v11 and v13. This check is denoted by the fact that arrows from variable nodes v2, v4, v11 and v13 are connected to check node cn1 in the bi-partite graph. The second parity check at cn2 determines if $v1 \oplus v7 \oplus v12=0$, the third parity check at cn3 determines if $v3 \oplus v5 \oplus v6 \oplus v9 \oplus v10=0$, the fourth parity check at cn4 determines if $v2 \oplus v8 \oplus v11=0$, the fifth parity check at cn5 determines if $v4 \oplus v7 \oplus v12=0$, the sixth parity check at cn6 determines if $v1 \oplus v5 \oplus v6 \oplus v9=0$, the seventh parity check at cn7 determines if $v2 \oplus v8 \oplus v10 \oplus v13=0$, the eighth parity check at cn8 determines if $v4 \oplus v7 \oplus v11 \oplus v12=0$, the ninth parity check at cn9 determines if $v1 \oplus v3 \oplus v5 \oplus v13=0$ and the tenth parity check at cn10 determines if $v7 \oplus v8 \oplus v9 \oplus v10=0$.

In one embodiment, the decoder 390 uses an iterative probabilistic decoding process involving iterative message passing decoding algorithms. These algorithms operate by exchanging messages between bit nodes and check nodes over the edges of the underlying bipartite graph representing the code.

The decoder 390 may be provided with initial estimates of the codeword bits (based on the content that is read from the memory structure 326). These initial estimates may be refined and improved by imposing the parity-check constraints that the bits should satisfy as a valid codeword. This may be done by exchanging information between the bit nodes representing the codeword bits and the check nodes representing parity-check constraints on the codeword bits, using the messages that are passed along the graph edges.

Figure 4A:
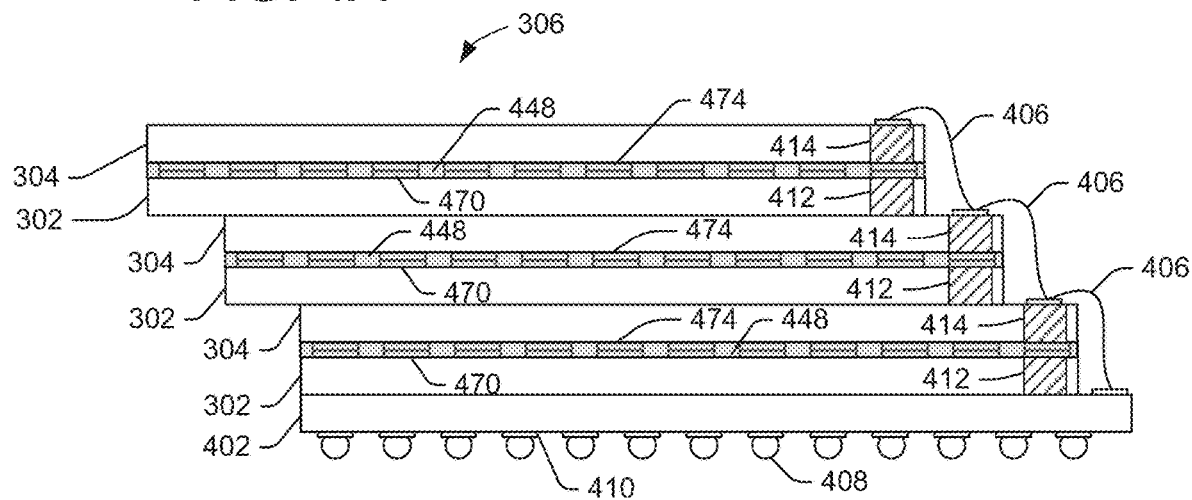
FIG. 4A depicts a side view of an embodiment of an integrated memory assembly stacked on a substrate.

In some embodiments, there is more than one control die 304 and more than one memory structure die 302 in an integrated memory assembly 306. In some embodiments, the integrated memory assembly 306 includes a stack of multiple control die 304 and multiple memory structure die 302. FIG. 4A depicts a side view of an embodiment of an integrated memory assembly 306 stacked on a substrate 402 (e.g., a stack comprising control dies 304 and memory structure dies 302). The integrated memory assembly 306 has three control dies 304 and three memory structure dies 302. In some embodiments, there are more than three memory structure dies 302 and more than three control die 304.

Each control die 304 is affixed (e.g., bonded) to at least one of the memory structure dies 302. Some of the bond pads 470, 474, are depicted. There may be many more bond pads. A space between two dies 302, 304 that are bonded together is filled with a solid layer 448, which may be formed from epoxy or other resin or polymer. This solid layer 448 protects the electrical connections between the dies 302, 304, and further secures the dies together. Various materials may be used as solid layer 448, but in embodiments, it may be Hysol epoxy resin from Henkel Corp., having offices in California, USA.

The integrated memory assembly 306 may for example be stacked with a stepped offset, leaving the bond pads at each level uncovered and accessible from above. Wire bonds 406 connected to the bond pads connect the control die 304 to the substrate 402. A number of such wire bonds may be formed across the width of each control die 304 (i.e., into the page of FIG. 4A).

A memory structure die through silicon via (TSV) 412 may be used to route signals through a memory structure die 302. A control die through silicon via (TSV) 414 may be used to route signals through a control die 304. The TSVs 412, 414 may be formed before, during or after formation of the integrated circuits in the semiconductor dies 302, 304. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 408 may optionally be affixed to contact pads 410 on a lower surface of substrate 402. The solder balls 408 may be used to electrically and mechanically couple the integrated memory assembly 306 to a host device such as a printed circuit board. Solder balls 408 may be omitted where the integrated memory assembly 306 is to be used as an LGA package. The solder balls 408 may form a part of the interface between the integrated memory assembly 306 and the memory controller 102.

Figure 4B:
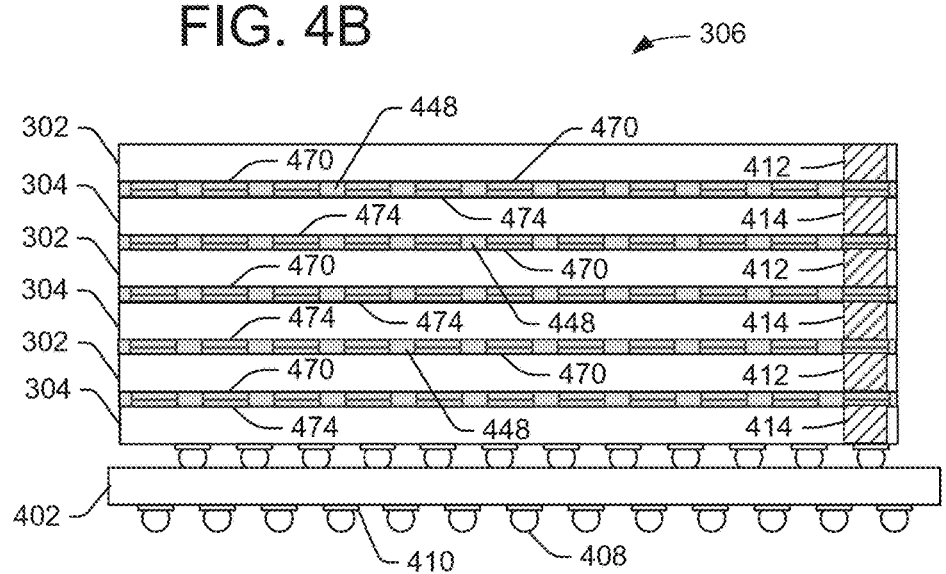
FIG. 4B depicts a side view of an embodiment of an integrated memory assembly stacked on a substrate.

FIG. 4B depicts a side view of an embodiment of an integrated memory assembly 306 stacked on a substrate 402. The integrated memory assembly 306 has three control die 304 and three memory structure die 302. In some embodiments, there are many more than three memory structure die 302 and many more than three control die 304. In this example, each control die 304 is bonded to at least one memory structure die 302. Optionally, a control die 304 may be bonded to two memory structure die 302.

Some of the bond pads 470, 474 are depicted. There may be many more bond pads. A space between two dies 302, 304 that are bonded together is filled with a solid layer 448, which may be formed from epoxy or other resin or polymer. In contrast to the example in FIG. 4A, the integrated memory assembly 306 in FIG. 4B does not have a stepped offset. A memory structure die through silicon via (TSV) 412 may be used to route signals through a memory structure die 302. A control die through silicon via (TSV) 414 may be used to route signals through a control die 304.

Solder balls 408 may optionally be affixed to contact pads 410 on a lower surface of substrate 402. The solder balls 408 may be used to electrically and mechanically couple the integrated memory assembly 306 to a host device such as a printed circuit board. Solder balls 408 may be omitted where the integrated memory assembly 306 is to be used as an LGA package.

As has been briefly discussed above, the control die 304 and the memory structure die 302 may be bonded together. Bond pads on each die 302, 304 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 302, 304. Where no such film is initially provided, a space between the dies may be under filled with an epoxy or other resin or polymer. The under-fill material may be applied as a liquid which then hardens into a solid layer. This under-fill step protects the electrical connections between the dies 302, 304, and further secures the dies together. Various materials may be used as under-fill material, but in embodiments, it may be Hysol epoxy resin from Henkel Corp., having offices in California, USA.

Figure 5:
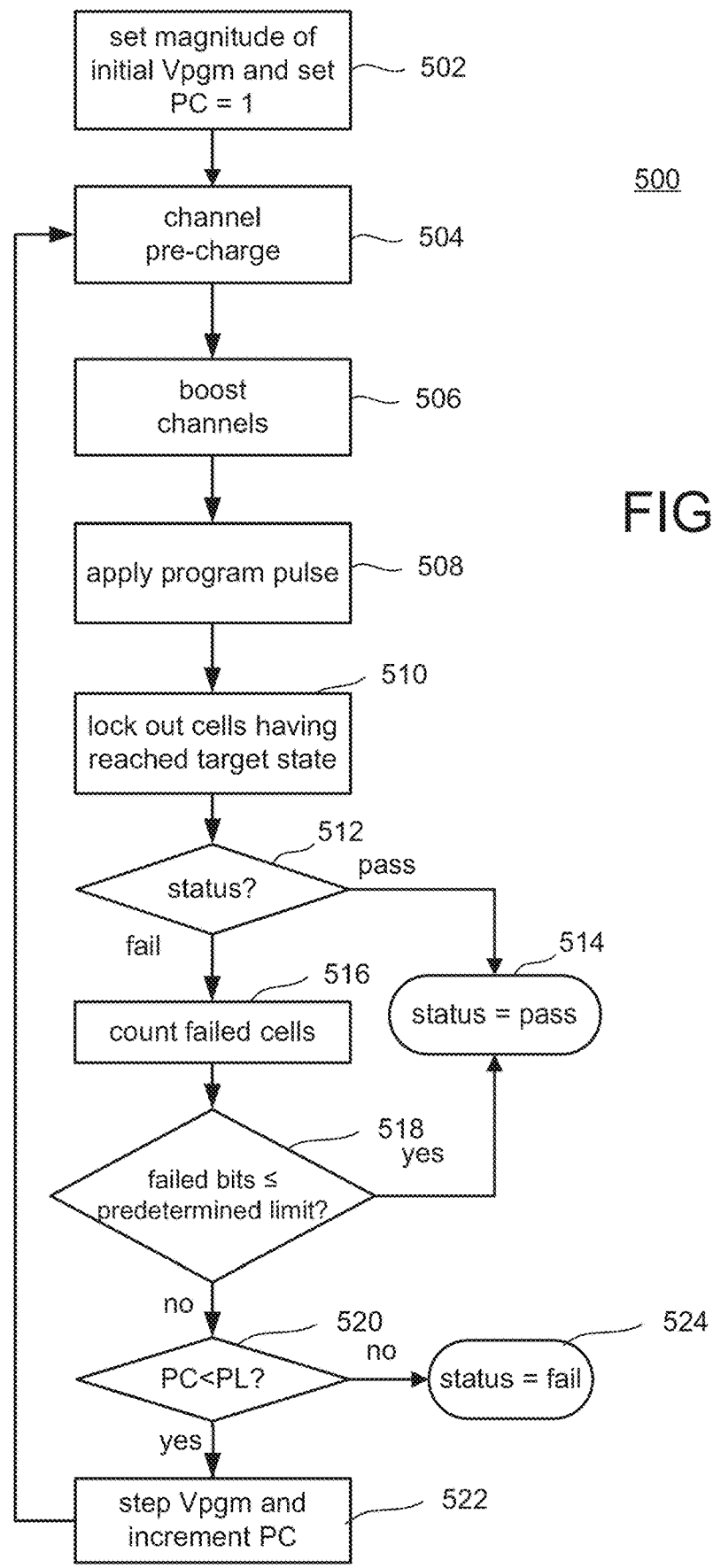
FIG. 5 is a flowchart describing one embodiment of a process for programming NAND strings of memory cells organized into an array.

FIG. 5 is a flowchart describing one embodiment of a process 500 for programming NAND strings of memory cells organized into an array. The process of FIG. 5 can be performed at the direction of state machine 312. In one example embodiment, the process of FIG. 5 is performed on memory die 300 using the control circuitry 310 (and read/write circuits 328, as well as decoders 332/324) discussed above. In one example embodiment, the process of FIG. 5 is performed by integrated memory assembly 306 using the control circuitry 310 discussed above. The process includes multiple loops, each of which includes a program phase (e.g., steps 504-508) and a verify phase (e.g., steps 510-518).

In many implementations, the magnitude of the program pulses is increased with each successive pulse by a predetermined step size. In step 502 of FIG. 5, the programming voltage (Vpgm) is initialized to the starting magnitude (e.g., ~12-16V or another suitable level) and a program counter PC maintained by state machine 312 is initialized at 1.

In one embodiment, the set of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 504 the memory system will pre-charge channels of NAND strings that include memory cells connected to the selected word line that are to be inhibited from programming.

In one embodiment, step 504 is the start of a program operation. In some embodiments, different sets of memory cells are programmed concurrently. For example, programming of memory cells in different memory structures 326 may be performed concurrently. In some embodiments, the start of concurrent program operations (e.g., step 504) is staggered such that step 504 occurs at different times for the different memory structures 326.

In step 506, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 508, a program pulse of the program signal Vpgm is applied to the selected word line (the word line selected for programming). If a memory cell on a NAND string should be programmed, then the corresponding bit line is biased at a program enable voltage, in one embodiment. Herein, such a NAND string is referred to as a "selected NAND string."

In step 508, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 510, memory cells that have reached their target states are locked out from further programming. Step 510 may include performing verifying at one or more verify reference levels. In one embodiment, the verification process is performed by testing whether the threshold voltages of the memory cells selected for programming have reached the appropriate verify reference voltage.

In step 510, a memory cell may be locked out after the memory cell has been verified (by a test of the Vt) that the memory cell has reached its target state.

If, in step 512, it is determined that all of the memory cells have reached their target threshold voltages (pass), the programming process is complete and successful because all selected memory cells were programmed and verified to their target states. A status of "PASS" is reported in step 514. Otherwise if, in step 512, it is determined that not all of the memory cells have reached their target threshold voltages (fail), then the programming process continues to step 516.

In step 516, the memory system counts the number of memory cells that have not yet reached their respective target threshold voltage distribution. That is, the system counts the number of memory cells that have, so far, failed to reach their target state. This counting can be done by the state machine 312, the memory controller 102, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 518, it is determined whether the count from step 516 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 514. In this situation, enough memory cells programmed correctly such that the few remaining memory cells that have not been completely programmed can be corrected using ECC during the read process. In some embodiments, the predetermined limit used in step 518 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 520 and the program counter PC is checked against the program limit value (PL). Examples of program limit values include 1, 12, 16, 19 and 30; however, other values can be used. If the program counter PC is not less than the program limit value PL, then the program process is considered to have failed and a status of FAIL is reported in step 524. If the program counter PC is less than the program limit value PL, then the process continues at step 522 during which time the Program Counter PC is incremented by 1 and the program voltage Vpgm is stepped up to the next magnitude. For example, the next pulse will have a magnitude greater than the previous pulse by a step size (e.g., a step size of 0.1-1.0 volts). After step 522, the process loops back to step 504 and another program pulse is applied to the selected word line so that another iteration (steps 504-522) of the programming process of FIG. 5 is performed.

At the end of a successful programming process, the threshold voltages of the memory cells should be within one or more distributions of threshold voltages for programmed memory cells or within a distribution of threshold voltages for erased memory cells, as appropriate. FIG. 6A illustrates example threshold voltage distributions for the memory array when each memory cell stores three bits of data. Other embodiments, however, may use other data capacities per memory cell (e.g., such as one, two, four, or five bits of data per memory cell). FIG. 6A shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 6A shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 6A also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 6A also shows Vev, which is a voltage level to test whether a memory cell has been properly erased.

In one embodiment, known as full sequence programming, memory cells can be programmed from the erased data state Er directly to any of the programmed data states A-G. For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state Er to data state B and/or from data state Er to data state C, and so on. The arrows of FIG. 6A represent the full sequence programming. In some embodiments, data states A-G can overlap, with control die 304 and/or memory controller 102 relying on error correction to identify the correct data being stored.

The technology described herein can also be used with other types of programming in addition to full sequence programming (including, but not limited to, multiple stage/phase programming). In one embodiment of multiple stage/phase programming, all memory cells to end up in any of data states D-G are programmed to an intermediate state that is no higher than D in a first phase. Memory cells to end up in any of data states Er-C do not receive programming in the first phase. In a second phase, memory cells to end up in either data state B or C are programmed to a state that is no higher than B; memory cells to end up in either data state F or G are programmed to a state that is no higher than F. In at third phase, the memory cells are programmed to their final states. In one embodiment, a first page is programmed in the first phase, a second page is programmed in the second phase, and a third page is programmed in the third phase. Herein, once on page has been programmed into a set of memory cells, the memory cells can be read back to retrieve the page. Hence, the intermediate states associated with multi-phase programming are considered herein to be programmed states.

In general, during verify operations and read operations, the selected word line is connected to a voltage (one example of a reference signal), a level of which is specified for each read operation (e.g., see read compare levels VrA, VrB, VrC, VrD, VrE, VrF, and VrG, of FIG. 6A) or verify operation (e.g. see verify target levels VvA, VvB, VvC, VvD, VvE, VvF, and VvG of FIG. 6A) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 6B depicts threshold voltage distributions and one page mapping scheme when each memory cell stores four bits of data. FIG. 6B depicts that there may be some overlap between the data states S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. However, by recalibrating soft bit reference levels, as disclosed herein, decoding time and success rate is improved.

As noted, FIG. 6B depicts an example in which four bits are stored per memory cell. Thus, four pages may be stored in a set of memory cells. Fifteen hard bit (HB) read reference levels are depicted (Vr1-Vr15). The set of memory cells may be connected to the same word line. Each HB read reference levels is used to distinguish between two adjacent threshold voltage distributions. Stated another way, each HB read reference levels is used to distinguish between two adjacent data states. For example, HB read reference level Vr4 is used to distinguish between data states S3 and S4.

FIG. 6B also depicts soft bit (SB) reference levels associated with four of the HB reference levels. There is one set of SB reference levels grouped around each of Vr1, Vr4, Vr6, and Vr11. For example, the set of SB reference levels Vr1_s1, Vr1_s2, Vr1_s3, and Vr1_s4 are grouped around HB reference level Vr1; the set of SB reference levels Vr4_s1, Vr4_s2, Vr4_s3, and Vr4_s4 are grouped around HB reference level Vr4; the set of SB reference levels Vr6_s1, Vr6_s2, Vr6_s3, and Vr6_s4 are grouped around HB reference level Vr6; and the set of SB reference levels Vr11_s1, Vr11_s2, Vr11_s3, and Vr11_s4 are grouped around HB reference level Vr11. There may be SB reference levels associated with the other HB reference levels, but they are not depicted in FIG. 6B. In FIG. 6B, there are four SB reference levels associated with each corresponding HB reference level, but there could be more or fewer SB reference levels associated with a HB reference level.

Note that although some embodiments disclosed herein are directed to memory cells in which the state is represented by a threshold voltage (Vt) of the memory cell, the state of the memory cell may be represented by another physical parameter including, but not limited to, resistance or conductance. For example, in FIGS. 6A and 6B, the data states are represented by Vt distributions. However, for other types of memory cells the data states may be represented by resistance distributions or conductance distributions.

In some embodiments, the soft bit reference voltages are used to read data in the memory cells when the ECC engine is not able to decode a codeword stored in the memory cells using data sensed using the hard bit reference voltages. Typically, there is a set of soft bit reference voltages for each hard bit reference voltage. The soft bit reference voltages are reference voltages at slightly higher voltages and slightly lower voltages that a corresponding hard bit reference voltage. The set of soft bit reference voltages are used to generate "soft" reliability information, which increases the correction capability of the decoder. Sensing at the soft bit reference voltages generates "soft-bits", which indicate whether the physical parameter (e.g., Vt, resistance) of a memory cell close to the hard bit reference level making the hard bit for that memory cell less reliable, or far from the hard bit reference level making the hard bit more reliable. In other words, if the soft reliability information indicates that a memory cell has its value for a physical parameter (e.g., Vt, resistance) close to the hard bit reference level, then this is considered less reliable than if the soft reliability information indicates that a memory cell has its value for a physical parameter (e.g., Vt, resistance) far from the hard bit reference level.

However, this correction capability depends on the quality of the soft reliability information. Using soft-bits that were not sensed in the correct location (e.g., correct voltage level) can degrade the quality of the soft reliability information and make it less informative. Setting the location of the soft-bit thresholds is a trade-off. If the soft-bit thresholds are too close to the hard bit (HB) threshold, then many of the errors are not marked as low reliability. FIG. 7A depicts an example in which the soft-bit reference levels might be set too close to the hard bit threshold. FIG. 7A depicts two adjacent memory cell distributions 702, 704. These two adjacent memory cell distributions 702, 704 correspond to two adjacent data states. In one embodiment, each memory cell distribution 702, 704 is a Vt distribution. In one embodiment, each memory cell distribution 702, 704 is a resistance distribution. The horizontal axis is labeled as "Sense Voltage" to indicate that, in some embodiments, a voltage is used to sense the memory cells. The sense voltage may be used to test a physical parameter of the memory cells such as, for example, Vt, resistance, or conductance. Sensing the physical parameter of the memory cells is not limited to using a voltage.

Hard bit (HB) reference level 706 is used to distinguish between the two adjacent memory cell distributions 702, 704. Stated another way, the HB reference level 706 is used to distinguish between the two adjacent data states. Two soft bit (SB) reference levels 708a, 708b are depicted. In one embodiment, the HB reference level 706 is a voltage that is used to distinguish between two Vt distributions. In one embodiment, the HB reference level 706 is a voltage that is used to distinguish between two resistance distributions. Hence, depending on the physical parameter of the memory cell that is being tested, the HB reference level 706 may correspond to a Vt of a memory cell, a resistance of a memory cell, or some other physical parameter of the memory cell. Similar reasoning applies to the SB reference levels 708.

Region 710 corresponds to a portion of the memory cells in memory cell distribution 704 that are in error because they have a value for a physical parameter (e.g., Vt, resistance) below the HB reference level 706. Stated another way, region 710 corresponds to a portion of the memory cells that were intended to be programmed to the data state associated with memory cell distribution 704, but now have a value for a physical parameter (e.g., Vt, resistance) below the HB reference level 706. However, since the memory cells in region 710 also have a value for a physical parameter (e.g., Vt, resistance) below the SB reference level 708a, they fall into a high reliability category. However, it is desirable to have such memory cells flagged as low reliability. Note that a phrase such as, "a memory cell has a resistance below the HB reference level 706" means that the resistance of the memory cell is below the resistance being tested by the HB reference level 706. Note that a phrase such as, "a memory cell has a Vt below the HB reference level 706" means that the Vt of the memory cell is below the Vt being tested by the HB reference level 706.

Region 712 corresponds to a portion of the memory cells in memory cell distribution 702 that are in error because they have a value for a physical parameter (e.g., Vt, resistance) above the HB reference level 706. Stated another way, region 712 corresponds to some of the memory cells that were intended to be programmed to the data state associated with memory cell distribution 702, but now have a value for a physical parameter (e.g., Vt, resistance) above the HB reference level 706. However, since the memory cells in region 712 also have a value for a physical parameter (e.g., Vt, resistance) above the SB reference level 708b, they fall into a high reliability category. However, it is desirable to have such memory cells flagged as low reliability.

On the other hand, if the soft-bit thresholds are too far from the hard bit (FIB) threshold, then too many correct bits are marked as unreliable. FIG. 7B depicts an example in which the soft-bit thresholds might be set too far from the hard bit threshold. FIG. 7B depicts two adjacent memory cell distributions 702, 704. Hard bit (HB) reference level 706 is used to distinguish between the two adjacent memory cell distributions 702, 704. Two soft bit (SB) reference levels 714a, 714b are depicted. Region 716 corresponds to a portion of the memory cells in memory cell distribution 702 that are correct because they have a value for a physical parameter (e.g., Vt, resistance) below the HB reference level 706. However, since the memory cells in region 716 also have a value for a physical parameter (e.g., Vt, resistance) above the SB reference level 714a, they fall into a low reliability category. However, it is desirable to have fewer memory cells flagged as low reliability. In other words, soft bit reference level 714a is set too far below the HB reference level 706. Region 718 corresponds to a portion of the memory cells in memory cell distribution 704 that are correct because they have a value for a physical parameter (e.g., Vt, resistance) above the HB reference level 706. However, since the memory cells in region 718 have a value for a physical parameter (e.g., Vt, resistance) below the SB reference level 714b, they fall into a low reliability category. However, it is desirable to have fewer memory cells flagged as low reliability. In other words, soft bit reference level 714b is set too far above the HB reference level 706.

Figure 8A:
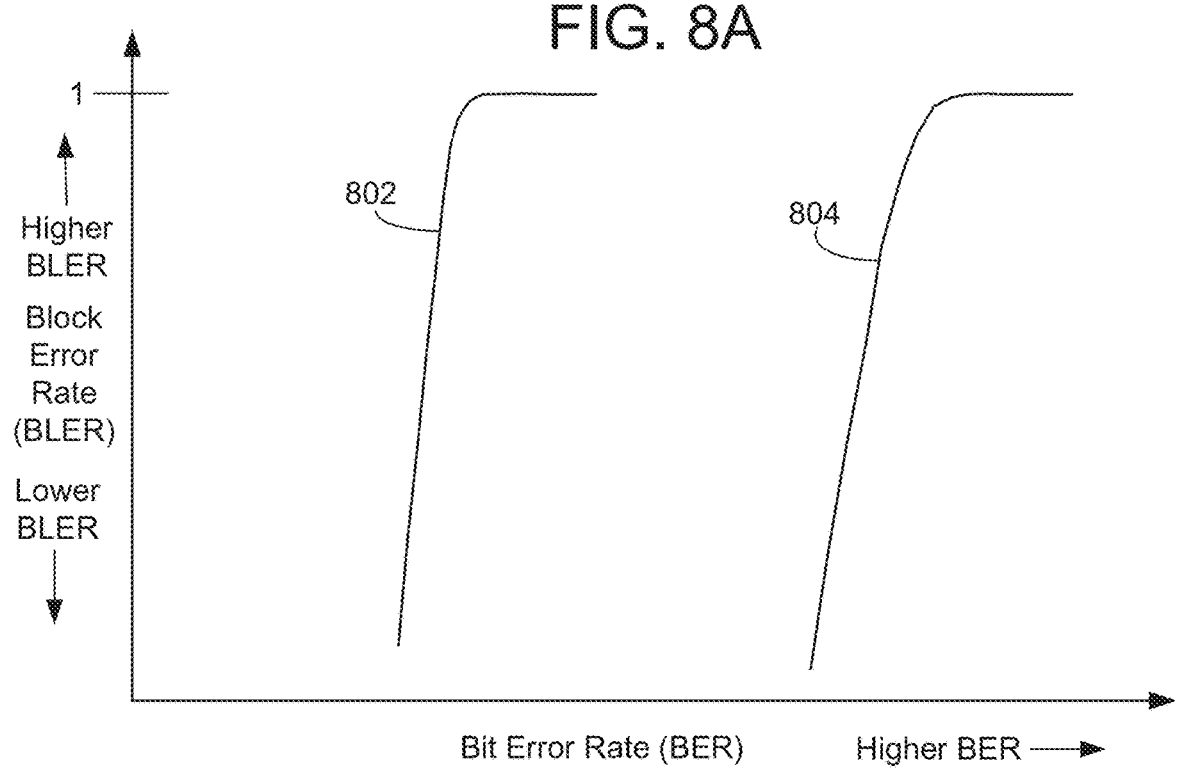
FIG. 8A depicts curves of bit error rates (BER) versus block error rate (BLER).

As noted above, soft bits can indicate reliability of a hard bit for each memory cell. FIG. 8A depicts curves of block error rate (BLER versus bit error rates (BER) The vertical axis is for block error rate (BLER) which is the probability the decoder will fail decoding a code-word. Error correction resulting in a low BLER is desirable. The horizontal axis is for bit error rate (BER) which is the amount of errors in the codeword. Error correction that is able to correct data having a higher BER is desirable. In other words, having a low BLER for a high BER is desirable. Curve 802 corresponds to using only hard bits during error correction. Curve 804 corresponds to using both hard bits and soft bits during error correction. For curve 804 it is assumed that the soft bit reference levels are established at suitable levels for good error correction. The curves 802, 804 illustrate that using both hard bits and soft bits significantly increases the error correction ability. For example, for two points on the curves 802, 804 having the same BLER, curve 804 corresponds to a higher BER. Thus, curve 804 illustrates that using both hard bits and soft bits can correct data having a higher BER than using only hard bits, while achieving the same BLER.

Figure 8B:
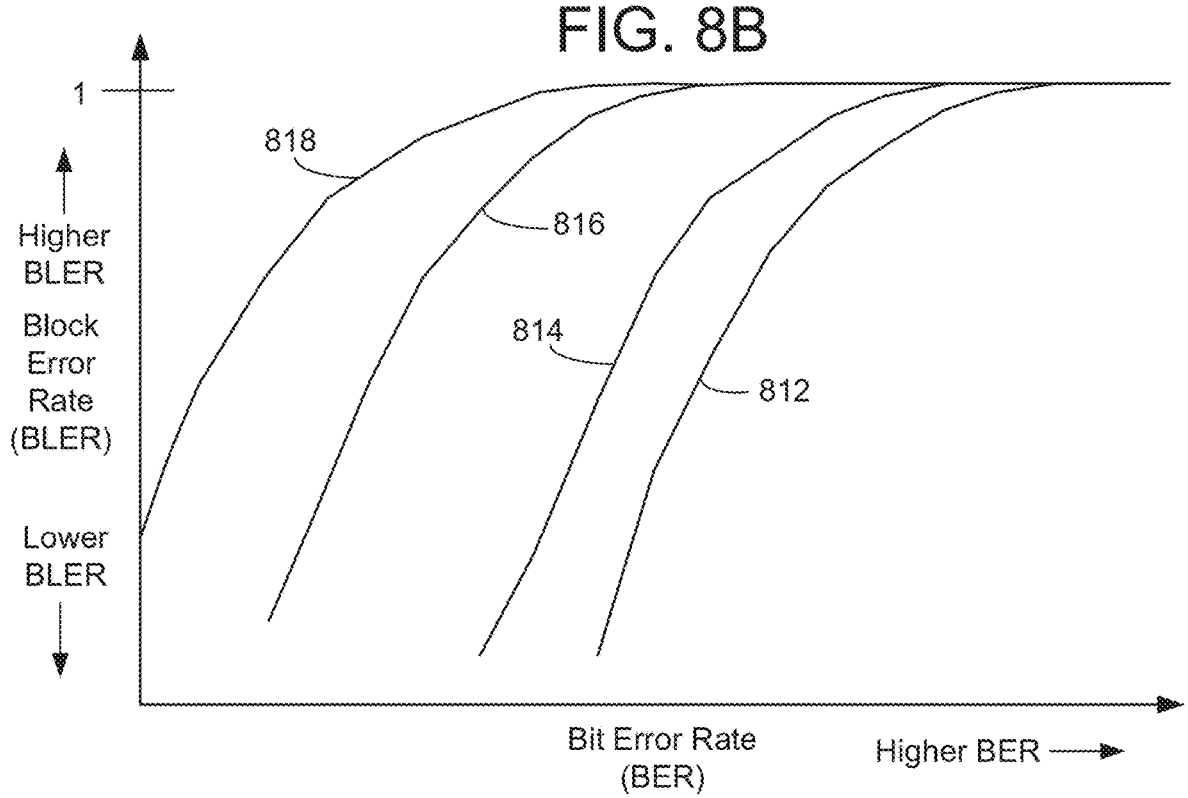
FIG. 8B depicts curves of BER versus BLER for different locations of the soft bit reference levels.

However, the location of the soft bit reference levels has a significant impact on the ability of the soft bits to improve the error correction. FIG. 8B depicts curves of BER versus BLER for different locations of the soft bit reference levels. The vertical axis is for block error rate (BLER). The horizontal axis is for bit error rate (BER). However, note that the scale (values) for BER in FIG. 8B do not necessarily correspond to those in FIG. 8A. Curve 812 represents the best location for the soft bit reference levels, curve 814 represents the second best location for the soft bit reference levels of those depicted, curve 816 represents the third best location for the soft bit reference levels of those depicted, and curve 818 represents the worst location for the soft bit reference levels of those depicted. These curves 812-818 indicate that if the location of the soft bit reference levels are not correctly chosen, then the error correction ability decreases.

Figure 9:
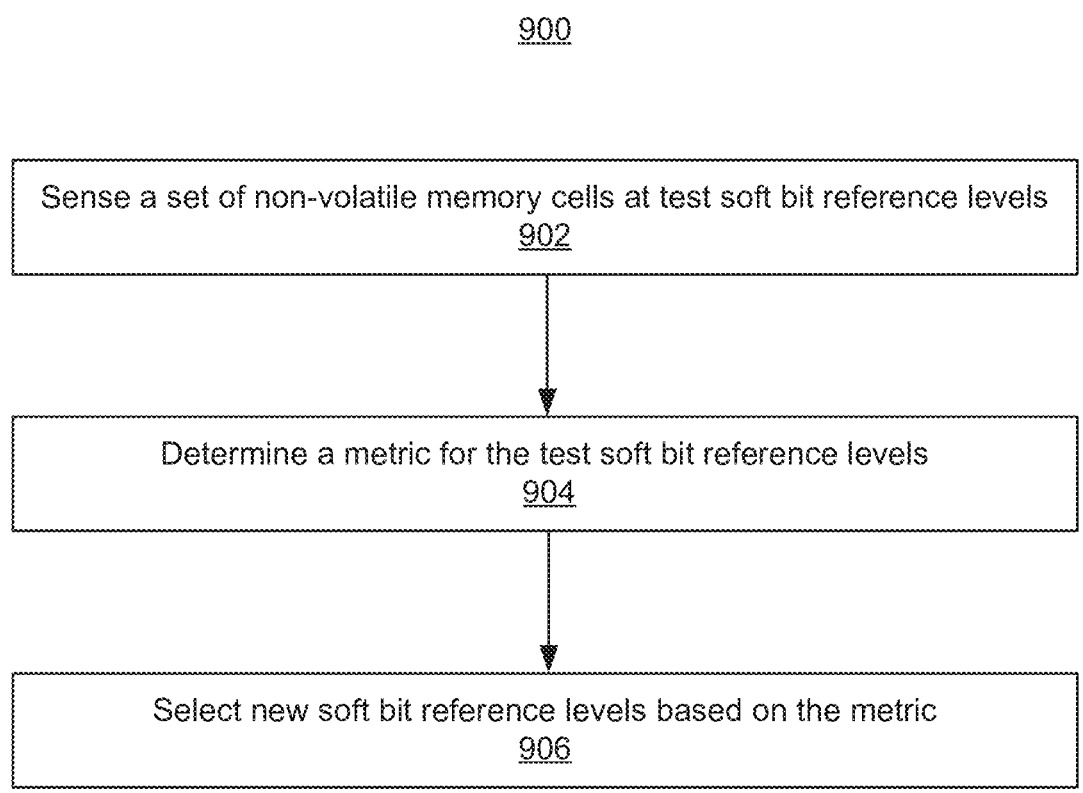
FIG. 9 depicts a flowchart of one embodiment of a process of calibrating soft bit reference levels.

FIG. 9 depicts a flowchart of one embodiment of a process 900 of calibrating soft bit reference levels. The process 900 may be used for memory cells that store one bit per cell (e.g., SLC) or multiple bits per cell (e.g., two, three, four, or more bits per cell). Typically, a set of soft bit reference levels is associated with (e.g., grouped around) a hard bit reference level. There may be any number of soft bit reference levels in the set. In one embodiment, there is one soft bit reference level on each side of the corresponding hard bit reference level. In one embodiment, there are two soft bit reference levels on each side of the corresponding hard bit reference level. In one embodiment, there are three soft bit reference levels on each side of the corresponding hard bit reference level. The process 900 will be described with respect to calibrating the soft bit reference levels associated with a particular hard bit reference level. The process 900 may be repeated to calibrate the soft bit reference levels associated with other hard bit reference levels. In some embodiments, once the soft bit reference levels associated with a first hard bit reference level have been calibrated, the soft bit reference levels associated with other hard bit reference levels may be calibrated based on the calibration of the first hard bit reference level.

In one embodiment, process 900 is triggered in response to not being able to decode data that was read from a set of memory cells. This could be a failure to decode using both hard bits and soft bits, for example. After calibrating the soft bit reference levels, another attempt may be made to decode the data using both hard bits and soft bits. Calibrating the soft bit reference levels helps to recover from the original failure to decode using both hard bits and soft bits. However, process 900 may be performed without having a decoding failure.

Step 902 includes sensing a set of non-volatile memory cells at test soft bit reference levels. The test soft bit reference levels are associated with a particular hard bit reference level. In one embodiment, the test soft bit reference levels are candidate soft bit reference levels in that the final (e.g., calibrated) soft bit reference levels will be selected from the test soft bit reference levels. However, the final (e.g., calibrated) soft bit reference levels are not required to be selected from the test soft bit reference levels. For example, a final soft bit reference level could be calculated as a mid-point between two test soft bit reference levels. Step 902 may also include sensing the memory cells at a hard bit reference level that corresponds to the test bit reference levels. In one embodiment, step 902 is performed by control circuitry 310 on the memory die 300. In one embodiment, step 902 is performed by control circuitry 310 on the control die 304.

Step 904 includes determining a metric for the test soft bit reference levels. In one embodiment, bins are defined based on the hard bit reference level and the test soft bit reference levels that are grouped around the hard bit reference level. Each bin may be defined by a pair of the reference levels, or in some cases only one of the test soft bit reference levels. The following describes a few ways in which the bins could be defined. A bin may be defined as the region between the hard bit reference level and one of the test soft bit reference levels. A bin may be defined as the region between two test soft bit reference levels on the same side of the hard bit reference level. A bin may be defined as the region below (e.g., having a lower reference voltage) the test soft bit reference having the lowest voltage. A bin may be defined as the region above (e.g., having a higher reference voltage) the test soft bit reference level having the highest voltage. In one embodiment, step 904 is performed by control circuitry 310 on the memory die 300. In one embodiment, step 904 is performed by control circuitry 310 on the control die 304. In one embodiment, step 904 is performed by memory controller 102.

In some embodiments, the metric includes either a percentage or a count of some variable for each bin. In one embodiment, the metric includes a percentage of the number of memory cells having a value for a physical parameter (e.g., Vt, resistance) in the respective bins. Further details of embodiments in which the metric is a percentage of memory cells having a value for a physical parameter (e.g., Vt, resistance) in the respective bins are shown and described with respect to FIGS. 10A-10C and 11.

In one embodiment, the metric includes a count of unsatisfied counters associated with each of the bins. Further details of embodiments in which the metric is a count of unsatisfied counters associated with each of the bins are shown and described with respect to FIG. 15.

Step 906 includes selecting new soft bit reference levels based on the metric for the test soft bit reference levels. The new soft bit reference levels could be selected from the test soft bit reference levels. However, a new soft bit reference level is not required to have the exact value of one of the test soft bit reference levels. In one embodiment, step 906 is performed by control circuitry 310 on the memory die 300. In one embodiment, step 906 is performed by control circuitry 310 on the control die 304. In one embodiment, step 906 is performed by memory controller 102.

Figure 10A:
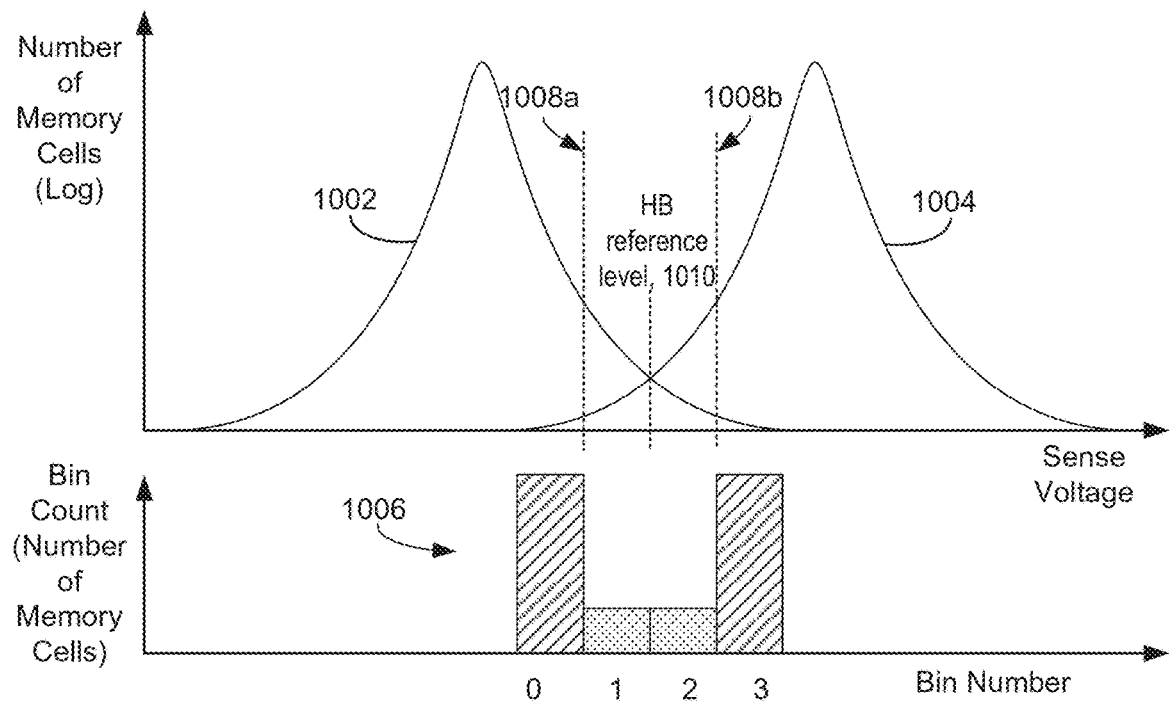
FIG. 10A depicts two memory cell distributions, as well as target bin counts.
Figure 10B:
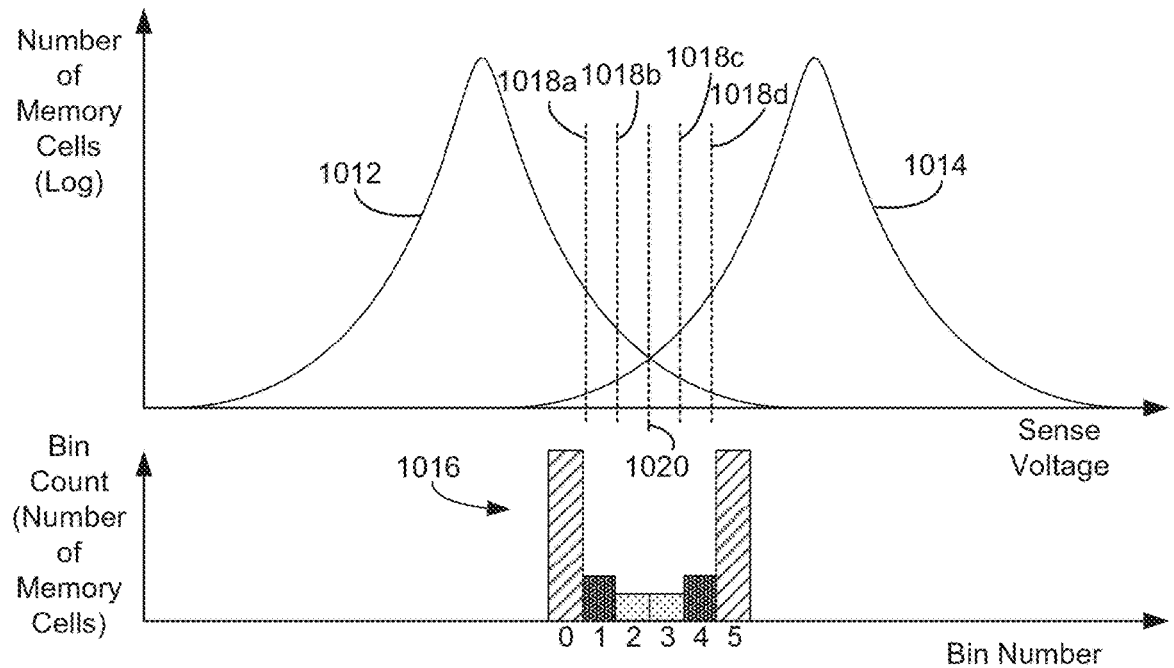
FIG. 10B an embodiment in which there are four SB reference levels associated with the HB reference level.
Figure 10C:
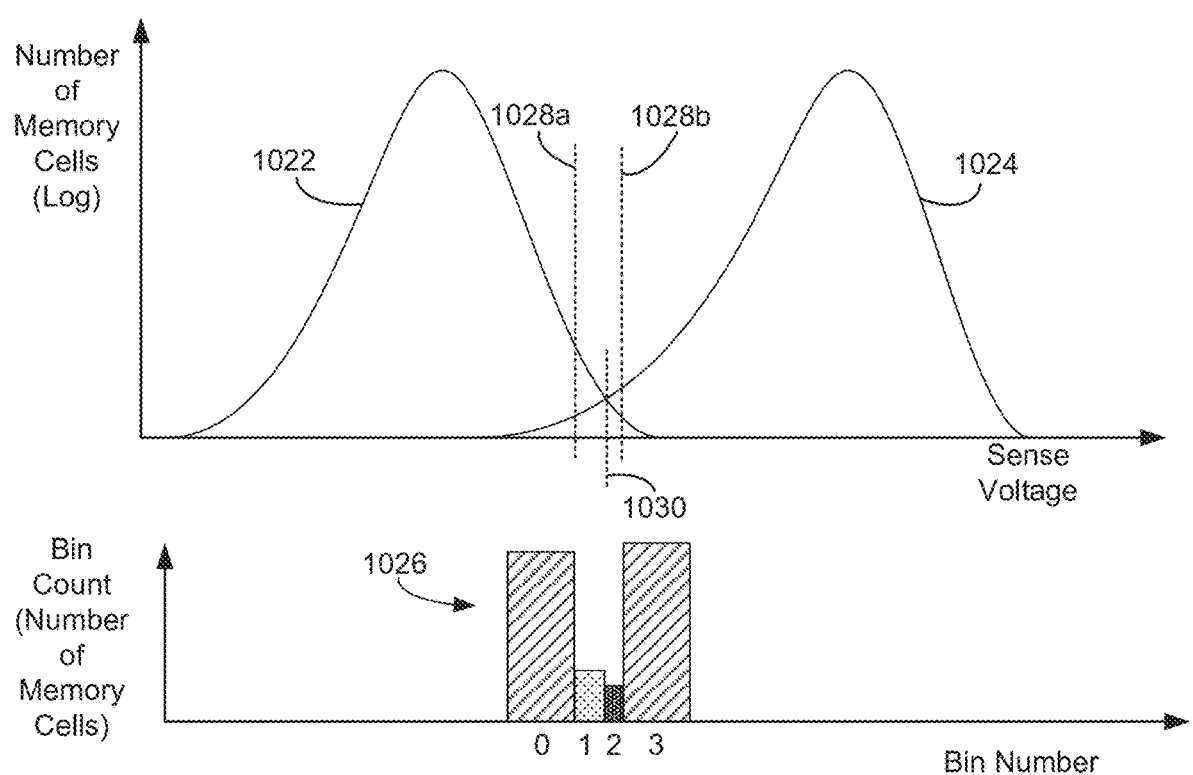
FIG. 10C depicts memory cell distributions and target bin counts for an embodiment in which the target bin counts are not symmetric with respect to the HB reference level.

In one embodiment, the metric in step 904 includes a percentage of memory cells having a value for a physical parameter (e.g., Vt, resistance) in the respective bins. FIGS. 10A-10C will now be discussed to illustrate embodiments of a percentage of memory cells having a value for a physical parameter (e.g., Vt, resistance) in the respective bins.

FIG. 10A depicts two memory cell distributions 1002, 1004, as well as target bin counts 1006. The two memory cell distributions 1002, 1004 could be the two cell distributions for a case in which the memory cells each store one bit (SLC), or two of the cell distributions when each memory cell stores multiple bits per cell (e.g., two, three, four, etc. bits per cell). In one embodiment, the two memory cell distributions 1002, 1004 are two adjacent distributions in FIG. 6B. For example, distribution 1002 might correspond to S3 and distribution 1004 might correspond to S4. Note that for purpose of explanation, counts of memory cells rather than percentages of memory cells may be used. Conversion between counts and percentages may easily be made by knowing the number of memory cells in the set under consideration. During soft bit calibration, the set under consideration corresponds to the set of memory cells that is sensed. There are two soft bit reference levels 1008a, 1008b. There is a lower SB reference level 1008a that has a lower sense voltage than the HB reference level 1010. There is an upper SB reference level 1008b that has a higher sense voltage than the HB reference level 1010. The HB reference level 1010 and the soft bit reference levels 1008 define four bins, which are referred to as bin 0, bin 1, bin 2, and bin 3. Bin 0 corresponds to memory cells having a value for a physical parameter (e.g., Vt, resistance) below the lower SB reference level 1008a. Bin 1 corresponds to memory cells having a value for a physical parameter (e.g., Vt, resistance) between the lower SB reference level 1008a and the HB reference level 1010. Bin 2 corresponds to memory cells having a value for a physical parameter (e.g., Vt, resistance) between the HB reference level 1010 and the upper SB reference level 1008b. Bin 3 corresponds to memory cells having a value for a physical parameter (e.g., Vt, resistance) above the upper SB reference level 1008b.

The target bin counts 1006 indicate a target count of memory cells for each respective bin. As noted, the targets may also be expressed as target percentages. In one embodiment, the SB reference levels 1008 are located such that the target percentages are met. For example, if the target percentages for bin 1 is set at 10 percent of the memory cells, then the lower SB reference level may be set at a location that results in 10 percent of the memory cells being in bin 1 (e.g., having a value for a physical parameter (e.g., Vt, resistance) between the lower SB reference level and the HB reference level). In one embodiment, the target percentages are established such that the soft bit reference levels will be in locations that optimize the error correction. In general, the target percentages are established such that calibrating the soft bit reference levels improves the error correction when using hard bits and soft bits.

Although FIG. 10A depicts an embodiment in which there are two SB reference levels 1008a, 1008b associated with the HB reference level 1010, other numbers of SB reference levels may be used. FIG. 10B an embodiment in which there are four SB reference levels associated with the HB reference level. FIG. 10B depicts two memory cell distributions 1012, 1014, as well as target bin counts 1016. There are four soft bit reference levels, 1018a, 1018b, 1018c, and 1018d. The HB reference level 1020 and the soft bit reference levels 1018 define six bins, which are referred to as bin 0, bin 1, bin 2, bin 3, bin 4, and bin 5. Bin 0 corresponds to memory cells having a value for a physical parameter (e.g., Vt, resistance) below the SB reference level 1018a. Bin 1 corresponds to memory cells having a value for a physical parameter (e.g., Vt, resistance) between SB reference level 1018a and SB reference level 1018b. Bin 2 corresponds to memory cells having a value for a physical parameter (e.g., Vt, resistance) between SB reference level 1018b and the HB reference level 1020. Bin 3 corresponds to memory cells having a value for a physical parameter (e.g., Vt, resistance) between the HB reference level 1020a and SB reference level 1018c. Bin 4 corresponds to memory cells having a value for a physical parameter (e.g., Vt, resistance) between the SB reference level 1018c and SB reference level 1018d. Bin 5 corresponds to memory cells having a value for a physical parameter (e.g., Vt, resistance) above SB reference level 1018d.

The target bin count 1016 indicate a target counts of memory cells for each respective bin. In one embodiment, the SB reference levels are located such that the counts are met. As noted, the target may also be expressed as a percentage of memory cells. For example, the location of SB reference level 1018b may be set relative to the HB reference level 1020 to meet the target percentage of memory cells in bin 2. The location of SB reference level 1018a may be set relative to SB reference level 1018b to meet the target percentage of memory cells in bin 1. Similar reasoning may apply for SB reference level 1018c and SB reference level 1018d with respect to bins 3 and 4. In one embodiment, the target percentages are established such that the soft bit reference levels will be in locations that optimize the error correction. In general, the target percentages are established such that calibrating the soft bit reference levels improves the error correction when using hard bits and soft bits.

In some embodiments, there are more than four SB reference levels associated with a HB reference level. In one embodiment, there are six SB reference levels associated with a HB reference level. In such an embodiment, there may be eight bins. For example, there may be three SB reference levels and four bins on each side of the HB reference level.

In some embodiments, the target percentages (or target counts) in the bins is symmetric with respect to the HB reference level. For example, in FIG. 10A, the target percentage in bin 1 and bin 2 may be the same. As another example, in FIG. 10B, the target percentage in bin 2 and bin 3 may be the same. Likewise, in FIG. 10B, the target percentage in bin 1 and bin 4 may be the same.

However, symmetry about the HB reference level is not required. FIG. 10C depicts memory cell distributions and target bin counts for an embodiment in which the target bin counts are not symmetric with respect to the HB reference level. FIG. 10C depicts two memory cell distributions 1022, 1024, as well as target bin counts 1026. There are two soft bit reference levels 1028a, 1028b. The HB reference level 1030 and the soft bit reference levels 1028 define four bins, which are referred to as bin 0, bin 1, bin 2, and bin 3. Bin 0 corresponds to memory cells having a value for a physical parameter (e.g., Vt, resistance) below the SB reference level 1028a. Bin 1 corresponds to memory cells having a value for a physical parameter (e.g., Vt, resistance) between the SB reference level 1028a and the HB reference level 1030. Bin 2 corresponds to memory cells having a value for a physical parameter (e.g., Vt, resistance) between the HB reference level 1030 and SB reference level 1028b. Bin 3 corresponds to memory cells having a value for a physical parameter (e.g., Vt, resistance) above the SB reference level 1028b.

The target bin counts 1026 indicate a target count of memory cells for each respective bin. The targets may also be expressed in as target percentages of memory cells. In the embodiment of FIG. 10C, the target percentage for bin 1 is different than the target percentage for bin 2. Hence, the target percentages are not symmetric with respect to the HB reference level 1030. In this example, the target percentage for bin 1 is larger than the target percentage for bin 2. However, another possibility is for the target percentage for bin 1 to be smaller than the target percentage for bin 2.

Note that the voltage gap between each SB reference level 1028 and the HB reference level 1030 could be the same or different. For example, SB reference level 1028a could be further from the HB reference level 1030 than SB reference level 1028b. These gaps are those that result from establishing the target counts (or percentage), and are not necessarily target reference levels. In this example, the larger percentage of memory cells in bin 1 (relative to bin 2) may result in SB reference level 1028a being further from the HB reference level 1030 than SB reference level 1028b. Referring again to FIG. 10A, the voltage gap between each SB reference level 1008a, 1008b and the HB reference level 1010 could be the same or different. In other words, even if the target counts (or percentages) in bins 1 and 2 are the same, this does not necessarily mean that the soft bit reference levels 1008a, 1008b will have the same voltage gap to the HB reference level 1010.

In some embodiments, the target percentages for the bins depends on a metric such as the BER or the syndrome weight of the set of memory cells. The BER could be an estimated BER of the set of memory cells. Table I shows example target percentages for each bin corresponding to a four bin embodiment.

TABLE I

| BER | Bin 0 | Bin 1 | Bin 2 | Bin 3 |
|-----|-------|-------|-------|-------|
| a % | 47%   | 3%    | 3%    | 47%   |
| b % | 46%   | 4%    | 4%    | 46%   |
| c % | 45%   | 5%    | 5%    | 45%   |
|     |       | ...   |       |       |
| n % | 35%   | 15%   | 15%   | 35%   |

The example in Table I is consistent with FIG. 10A. Each row in Table I corresponds to a different BER. For generality, specific BERs are not depicted in Table I. In one embodiment, the BERs increase moving down the rows in Table I. In Table I, the percentages for Bin 1 and Bin 2 are the same for a given row. However, the percentages for Bin 1 and Bin 2 in a given row could be different from each other. In Table I, the percentages for Bin 1 and Bin 2 increase moving down from one row to the next. The percentages in Bin 1 and Bin 2 are designed to optimize error correction for a given BER. For example, 15 percent in Bin 1 and Bin 2 will optimize error correction for a BER of n % (where n % will depend on characteristics of the memory device). In one embodiment, one or more tables such as Table I are learned offline and stored in the memory system 100. For example, one or more tables such as Table I could be stored in memory controller 102, a memory package 104, a memory die 300, a memory structure die 302, or a control die 304. In one embodiment, one or more tables such as Table I are stored in storage region 326a of the memory structure 326.

In some embodiments, the target percentages for the bins depends on the syndrome weight of the set of memory cells. Hence, Table I could be modified to replace the BER with syndrome weight. Also note that there could be different tables for different HB reference levels. Moreover, there may be different soft bits schemes, such as a scheme with two SB reference levels for a HB reference level, four SB reference levels for a HB reference level, six SB reference levels for a HB reference level etc. There may be a different Table for each such scheme to account for the different number of bins in each scheme. Also, there could be a different table for each sense location. For example, with respect to FIG. 6B, there could be a different table for each reference level (e.g., there could be a separate table for each of Vr1-Vr15). However, in some cases, the same table might be used for two or more sense locations. For example, two or more of the reference levels in FIG. 6B could share the same table.

Figure 11:
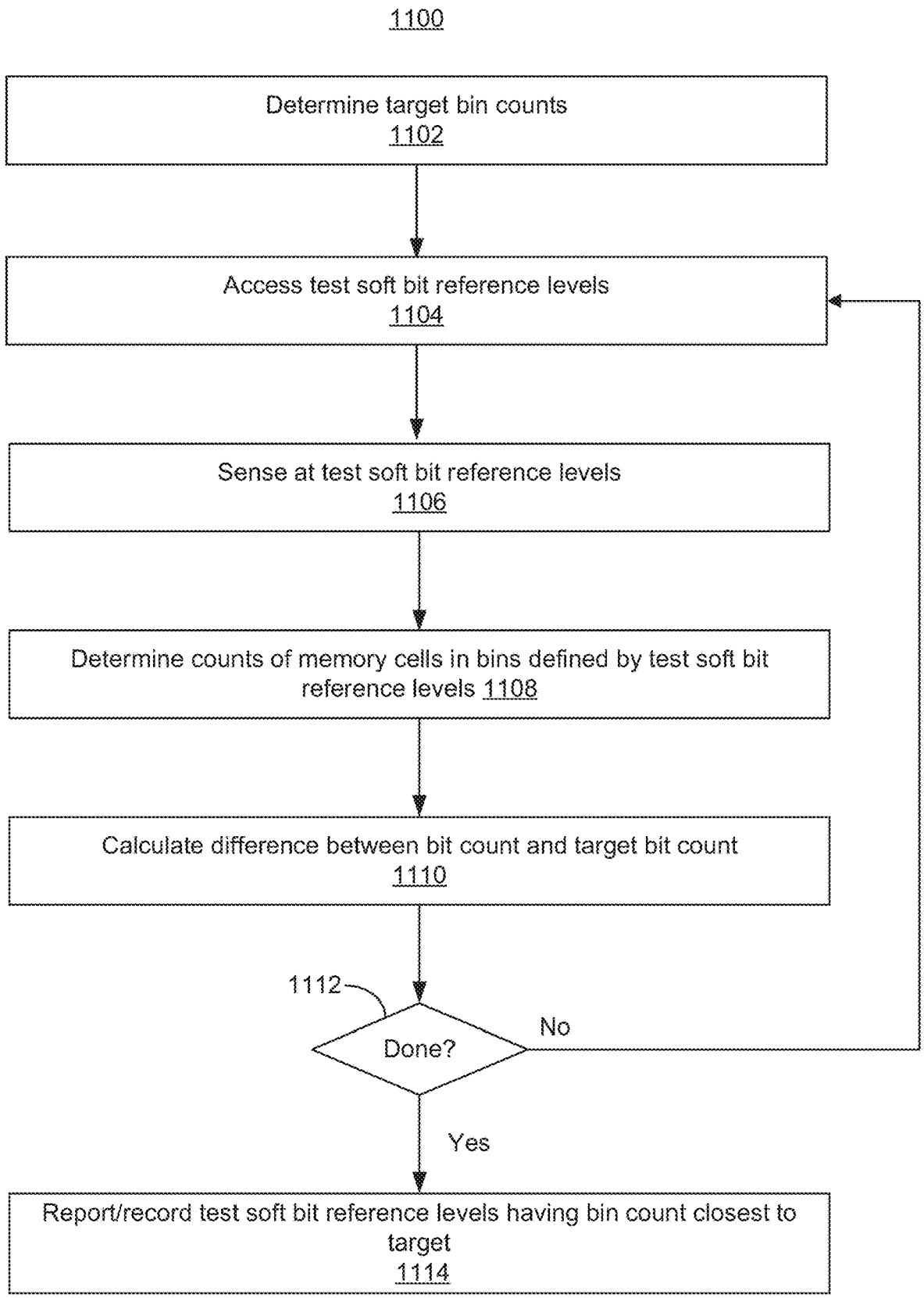
FIG. 11 depicts one embodiment of a process of calibrating soft bit reference levels based on target bin counts.

FIG. 11 depicts one embodiment of a process 1100 of calibrating soft bit reference levels based on target bin counts (or target bin percentages). The process 1100 will be described in terms of calibrating soft bit reference levels for a set of non-volatile memory cells. Once calibrated, those soft bit reference levels could be used for other groups of memory cells that are similarly situated. For example, the calibrated soft bit reference levels could be used for other memory cells in the same block, other memory cells having the same program/erase cycle count, other memory cells on the same die, etc.

The various steps in process 1100 could be performed on the memory die 300, the control die 304, and/or the memory controller 102. In some embodiments, some steps are performed on the memory die 300 and others on the memory controller 102. In some embodiments, some steps are performed on the control die 304 and others on the memory controller 102.

Step 1102 includes determining target bin counts. FIGS. 10A-10C depict various embodiments of target bin counts. In one embodiment, the target bit count is determined by accessing a table, such as Table I that has target bin percentages. The target counts may then be calculated based on the total number of memory cells that are sensed in step 1106. This could be, for example, all of the memory cells connected to one word line. Step 1102 could be performed by control circuitry 310 on the memory die 300, by control circuitry 310 on the on the control die 304, or the memory controller 102.

In some embodiments, the target bin counts are based on a BER of the set of memory cells. In such an embodiment, first a BER of the set of memory cells is determined, or at least estimated. Then, a table such as Table I is consulted such that the row that is closest to the BER is selected. The BER may be determined (or estimated) in a variety of ways. As noted above, the calibration of the soft bit reference levels might or might not be triggered by a failure to decode data read from the set of memory cells. In the event that the data was successfully read, then a BER may be calculated for the data stored in the memory cells. In the event that the data was not successfully read, another option is to determine an actual BER for data decoded from similarly situation memory cells, such as memory cells connected to a different word line in the block.

In some embodiments, the target bin counts are based on a syndrome weight of the set of memory cells. In such an embodiment, first a syndrome weight of the set of memory cells is determined. The syndrome weight may be determined even if the data that was read from the memory cells is not successfully decoded. Then, a table such as Table I is consulted such that the row that is closest to the syndrome weight is selected.

It is not required that the target bin counts are selected based on a factor such as BER or syndrome weight. In one embodiment, the target bin count does not depend on either BER or syndrome weight of the set of memory cells. For example, rather than using a table such as Table I with multiple rows corresponding to different BERs, a table having a single row could be used. This single row could be one of the rows from Table I.

Step 1104 includes accessing test SB reference levels. FIG. 12 will be referred to in order to discuss an example of test SB reference levels. FIG. 12 depicts two memory cell distribution 1202, 1204. Hard bit (HB) reference level 1206 is used to distinguish between these two memory cell distributions 1202, 1204. As in other examples herein, there is some overlap between the two memory cell distributions 1202, 1204. A number of test SB reference levels 1208 are depicted. The test SB reference levels 1208 are labeled as pairs with one member of each pair on each side of the HB reference level 1206. Step 1104 could be performed by control circuitry 310 on the memory die 300, by control circuitry 310 on the memory die 300, or the memory controller 102. For example, the test soft bit reference levels could be stored in storage region 326a, storage region 318, or memory on the controller 102. If the test soft bit reference levels are stored in the memory controller 102, the controller 102 sends the test soft bit reference levels to either the memory die 300 or the control die 304.

Referring again to FIG. 11, step 1106 includes sensing non-volatile memory cells at the test SB reference levels 1208. Note that the memory cells are also sensed at the HB reference level 1206 at some point. There are numerous techniques that may be used to sense at the test SB reference levels 1208. With reference to FIG. 12, in one embodiment, the memory cells are sensed at the levels labeled "a" on each side of the HB reference level 1206 to determine, for each memory cell, whether its value for a physical parameter (e.g., Vt, resistance) falls between either "a" level and the HB reference level 1206. In a later iteration of step 1106, the memory cells are sensed at the levels labeled "b" on each side of the HB reference level 1206 to determine, for each memory cell, whether its value for a physical parameter (e.g., Vt, resistance) falls between either "b" level and the HB reference level 1206. Similar sensing may be performed for the "c" "d" and "e" levels for still later iterations of step 1106. Step 1106 is typically performed by either control circuitry 310 on the memory die 300 or by control circuitry 310 on the control die 304.

Referring again to FIG. 11, step 1108 includes determining counts (or percentages) of memory cells in bins defined by the HB reference level and the test SB reference levels. FIG. 13 depicts an example of counts for each of four bins for an example that corresponds to levels a-e in FIG. 12. Five bin counts 1302(a)-1302(e) are depicted in FIG. 13. These are actual counts of memory cells having a value for a physical parameter (e.g., Vt, resistance) in each of the bins, as opposed to being targets. Line 1304 represents a target counts of memory cells for bin 1 and bin 2. Line 1306 represents a target count of memory cells for bin 0 and bin 3. Step 1108 could be performed by control circuitry 310 on the memory die 300, by control circuitry 310 on the memory die 300, or the memory controller 102.

Step 1110 includes calculating a difference between the actual bin counts and the target bin counts. With reference to FIG. 13, assuming this is the first iteration such that sensing produced counts 1302(a), for bins 1 and 2 the difference is determined based on the target bin count 1304 and the actual bin count 1302(a). In this example, the actual bin counts 1302(d) are the closest to the target counts. Therefore, sensing at level "d" in FIG. 12 produced the closest bin counts. Step 1110 could be performed by control circuitry 310 on the memory die 300, by control circuitry 310 on the memory die 300, or the memory controller 102.

Step 1112 is a determination of whether sensing is to be performed at other test SB reference levels. If so, steps 1104-1110 are repeated for another set of test SB reference levels. Step 1112 could be performed by control circuitry 310 on the memory die 300, by control circuitry 310 on the memory die 300, or the memory controller 102. When all test SB reference levels have been processed, control passes to step 1114.

Step 1114 includes reporting (or recording) the test soft bit reference levels having the bin count closest to the target. The new soft bit reference levels are based on these reported (or recorded) levels. In the example of FIG. 13, the test soft bit reference levels "d" would be reported (or recorded). In one embodiment, the memory die 300 reports the test soft bit reference levels to the memory controller 102. In one embodiment, the control die 304 reports the test soft bit reference levels to the memory controller 102. In one embodiment, the memory controller 102 itself determines the test soft bit reference levels having the bin count closest to the target, and hence simply records these.

In some embodiments, the test soft bit reference level that is reported/recorded is not exactly at one of the test SB reference levels. For example, the soft bit reference level that is reported/recorded could be mid-way between two test SB reference levels that each have actual bin counts close to the target. For example, if the actual bin count 1302(d) is slightly lower than the target 1304 and the actual bin count 1302(e) is slightly higher than the target 1304, then the soft bit reference level that is reported could be mid-way between level "d" and level "e".

As the flow of FIG. 11 was described with reference to FIG. 12, the test SB reference levels in each iteration included symmetrically situated SB reference levels. For example, the levels at "a" on each side of the HB reference level 1206 were paired, the levels at "b" on each side of the HB reference level 1206 were paired, etc. However, it is not required that that levels on each side of the HB reference level 1206 be symmetrically situated. For example, a test pair could include level "b" on the lower side of the HB reference level 1206 and level "a" on the upper side of the HB reference level 1206. Further details are discussed below (see FIGS. 18, 19 and associated discussion) in which soft bit reads may be "emulated" in order to provide for such additional test pairs without the need to perform additional senses of the memory cells.

As noted above, in some embodiments, there are target percentages or counts for the bins. The following describes details of an embodiment of calculating target bin count distributions. This calculation may be performed offline, with the results being stored in the memory system 100. In one embodiment, it is assumed that the memory cell distributions have Gaussian distributions. The optimal threshold is the one that maximizes the mutual information between the data programmed into the memory cells and the data read from the memory cells. This threshold is used to calculate the optimal bin count, that is, the expected amount of cells in each soft bit bin for the optimal threshold location.

Figure 14:
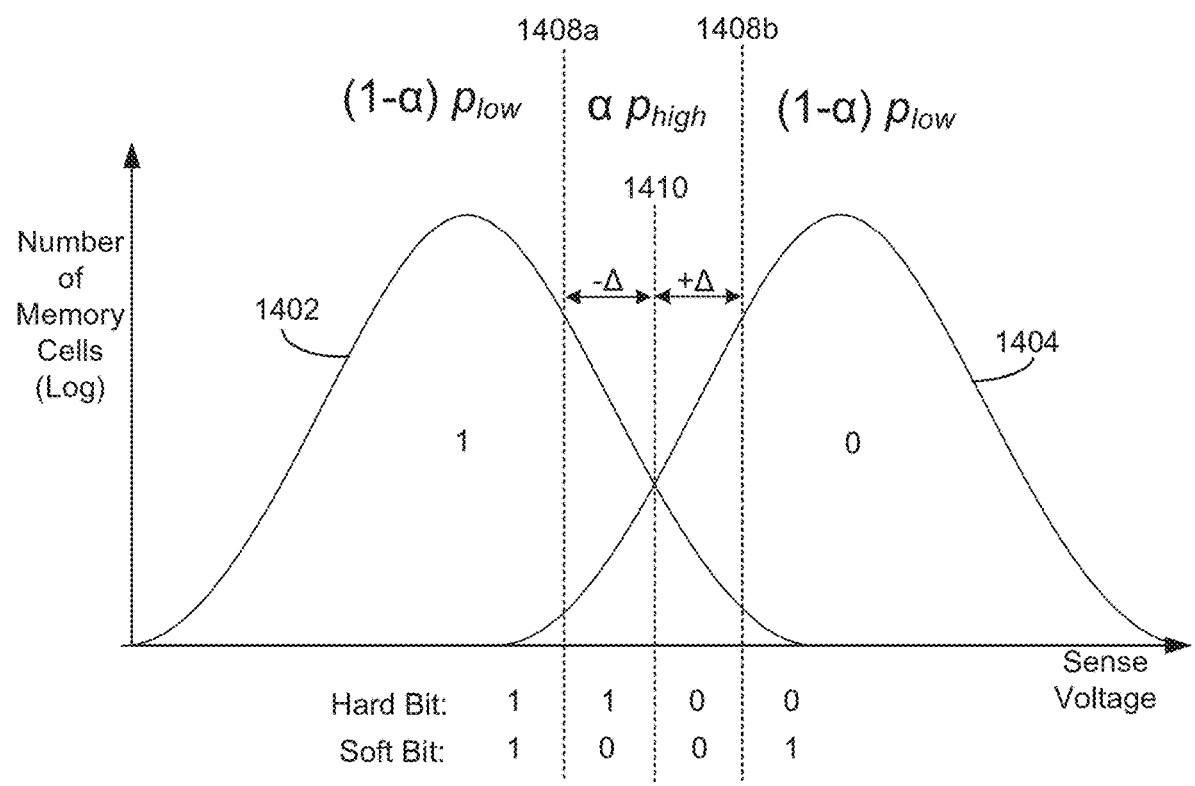
FIG. 14 depicts two memory cell distributions to illustrate principles of determine target bin counts.

FIG. 14 will be referred to in order to provide context for calculating target bin count distributions. FIG. 14 shows two memory cell distributions 1402, 1404. For the sake of explanation, it will be assumed that distributions 1402, 1404 are Gaussian. Distribution 1402 is labeled as representing a data state having a hard bit of "1", whereas distribution 1404 is labeled as representing a data state having a hard bit of "0". Two soft bit reference levels 1408a, 1408b, and a hard bit reference level 1410 are depicted. Memory cells having a value for a physical parameter (e.g., Vt, resistance) between the two soft bit reference levels 1408a, 1408b have a soft bit of "0". Memory cells having a value for a physical parameter (e.g., Vt, resistance) lower than soft bit reference level 1408a have a soft bit of "1". Memory cells having a value for a physical parameter (e.g., Vt, resistance) higher than soft bit reference level 1408b have a soft bit of "1". In one embodiment, the value for the soft bit is generated by performing a logical operation on the results of the two soft bit senses (at 1408a, 1408b). In one embodiment, an NXOR operation is performed on the results of the two soft bit senses (at 1408a, 1408b) to generate the soft bit. The parameter Δ is depicted as the region between a soft bit reference level 1008 and the hard bit reference level 1410. The parameter Δ is the SB threshold offset. The parameters α, $p_{low}$, and $p_{high}$ are also depicted. The parameter α is the proportion of memory cells in the low reliability bins. Note that 1−α is the proportion of memory cells in the high reliability bins (e.g., the memory cells in the bins furthest from the HB transition). These parameters will be discussed in the following explanation and Equations 1-9.

The standard-deviation (σ) of the Gaussian distribution can be calculated according the BER, as in Equation 1.

$$BER = Q\left(\frac{1}{2\sigma}\right) \quad (1)$$

Re-arranging Equation 1 provides a formula for the standard deviation (see Equation 2).

$$\sigma = \frac{1}{2Q^{-1}(BER)} \quad (2)$$

In Equations 1 and 2, Q is as described in Equation 3.

$$Q(x) = \frac{1}{\sqrt{2\pi}} \int_x^\infty e^{-v^2/2} dv \quad (3)$$

The optimal threshold location can then be calculated as follows. Assume that A is the SB threshold offset and α is the proportion of bits in the low reliability (high BER) bins and (1−α) is the proportion of bits in the high reliability (low BER) bins. Then, the BER may be expressed as in Equation 4.

$$BER = \alpha \cdot p_{low} + (1-\alpha) \cdot p_{high} \quad (4)$$

Equation 4 may be re-arranged to provide an expression for alpha (see Equation 5).

$$\alpha = Q\left(\frac{0.5-\Delta}{\sigma}\right) - Q\left(\frac{0.5+\Delta}{\sigma}\right) \quad (5)$$

An expression for $p_{high}$ may be derived from Equations 4 and 5 (see Equation 6).

$$p_{high} = \frac{Q\left(\frac{0.5}{\sigma}\right) - Q\left(\frac{0.5+\Delta}{\sigma}\right)}{\alpha}, \quad p_{low} = \frac{Q\left(\frac{0.5+\Delta}{\sigma}\right)}{1-\alpha} \quad (6)$$

Then, the conditional channel probability may be calculated (see Equation 7).

$$p(y \mid x) = \quad (7)$$
$$\begin{bmatrix} p_{low}(1-\alpha) & p_{high}\alpha & (1-p_{high})\alpha & (1-p_{low})(1-\alpha) \\ (1-p_{low})(1-\alpha) & (1-p_{high})\alpha & p_{high}\alpha & p_{low}(1-\alpha) \end{bmatrix},$$
$$p_x = [\, 0.5 \;\; 0.5 \,]$$

The mutual information (MI) between the programmed data (x) and the data read (y) from the memory cell may then be calculated (see Equation 8).

$$MI = H(p_y) - H(p_{y|x}) = H(p_{y|x} \cdot p_x) - H(p_{y|x}) \quad (8)$$

In Equation 8, H is the entropy function. The MI is an excellent proxy for the ECC decoder correction capability. Therefore, in one embodiment, the MI is maximized. Therefore, for each BER point, the A values are scanned. The A that maximizes the MI is chosen (see Equation 9). Recall from FIG. 14 that A is the SB reference level offset.

$$\Delta_{opt}(BER) = \underset{\Delta}{\mathrm{argmax}} MI(\Delta, BER) \quad (9)$$

The foregoing describes one way to determine optimal SB threshold locations; however, other techniques may be used. In another embodiment, the optimal SB threshold locations are calculated empirically. This means that the threshold location is scanned, assuming some channel model. The decoder correction capability may be calculated with a Monte-Carlo simulation. This method requires more computations, but is applicable to any channel distribution (not necessarily Gaussian).

Once the optimal SB threshold location is calculated, the optimal bin count distribution may be calculated. The optimal bin count distribution may be stored in the form of a table, such as Table I above.

As noted above, in one embodiment of process 900, the metric includes unsatisfied counters. The unsatisfied counters may be computed for each bin. This allows mutual information between the data programmed into the set of memory cells and the data that was read from the set to be determined. The mutual information serves as a good proxy for the ability of the ECC engine to correct the data. In one embodiment, the soft bit reference levels are established a levels that maximizes the aforementioned mutual information.

Figure 15:
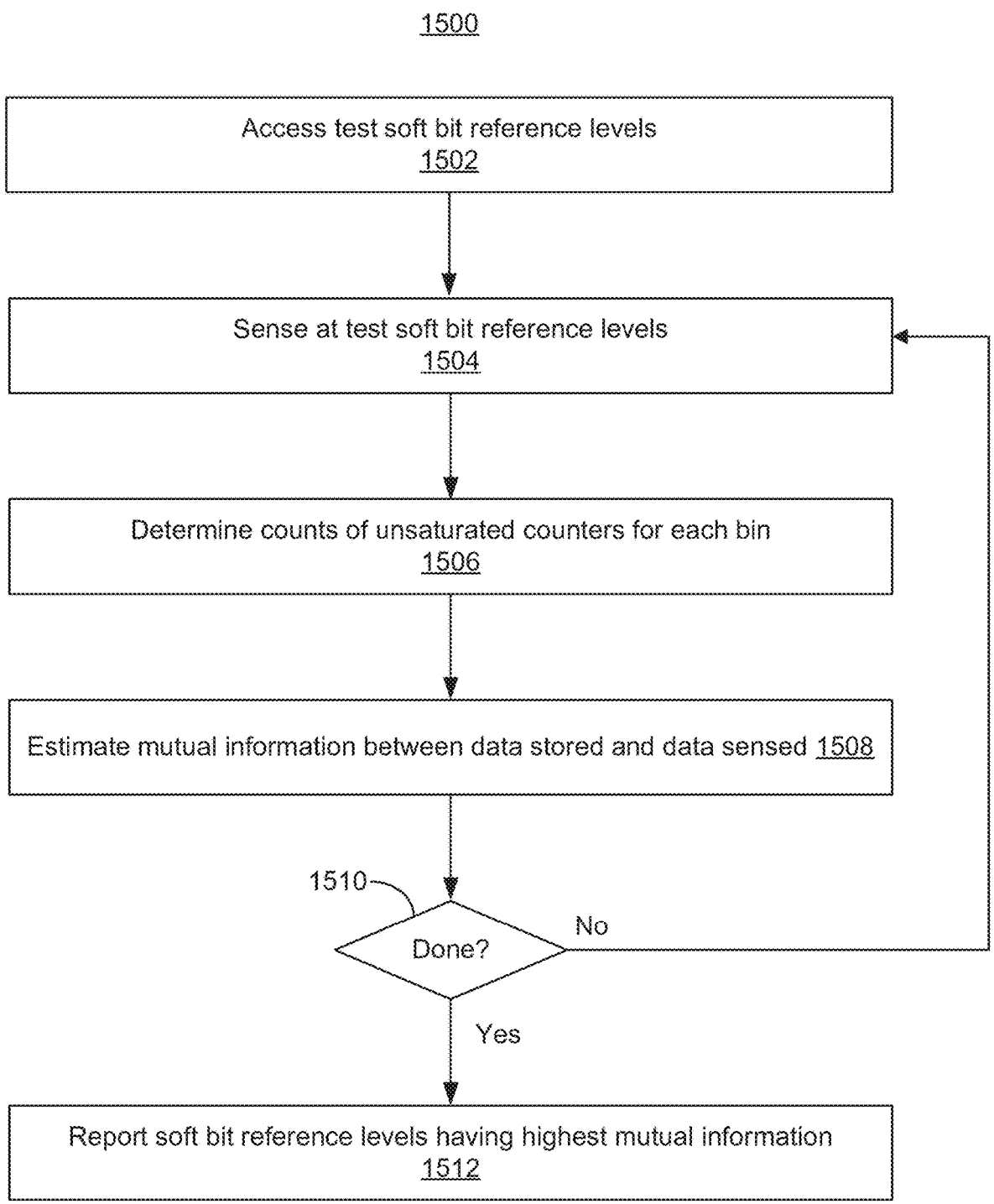
FIG. 15 describes one embodiment of a process of calibrating SB reference levels based on mutual information between the data programmed into the set of memory cells and the data that was read from the set to be determined.

FIG. 15 describes one embodiment of a process 1500 of calibrating SB reference levels based on mutual information between the data programmed into the set of memory cells and the data that was read from the set to be determined. In process 1500, the metric that is calculated includes unsatisfied counters. The unsatisfied counters may be determined for different bins that are defined by a hard bit reference level and the test soft bit reference levels. The mutual information is determined based on the unsatisfied counters. Thus, process 1500 provides further details of one embodiment of process 900 in which the metric in step 906 includes unsatisfied counters.

Step 1502 includes accessing test soft bit reference levels. Step 1504 includes sensing a set of non-volatile memory cells at the test reference levels. Steps 1502 and 1504 may resemble steps 1104 and 1106 from FIG. 11. Hence, steps 1502 and 1504 will not be described in detail.

Step 1506 includes determining counts of unsatisfied counters for each bin. In one embodiment, for each bit in the codeword, there is a value for an unsatisfied counter. The unsatisfied counters are related to the syndrome weight, which is the number of unsatisfied check nodes (check nodes could also be referred to as parity check equations). The unsatisfied counter for a particular bit is the number unsatisfied check nodes to which the bit is connected. Another way to express this is that the unsatisfied counter for a particular bit is the number unsatisfied parity check equations the bit participates in. For example, if a bit of the codeword is connected to four check nodes, three of which are unsatisfied, then the unsatisfied counter for that bit is three. Herein, a vector C will be used to represent the unsatisfied counters for the bits in the codeword. Equation 10 describes one technique for calculating the syndrome bit vector (s).

$$s = H^* \text{codeword}(\text{mod-2}) \quad (10)$$

Equation 10 states that the syndrome bits (s) is a vector that is arrived at by multiplying a parity check matrix (H) by the codeword. In one embodiment, the weight is based on the number of ones in S. Equation 11 describes one technique for calculating the unsatisfied counters vector (u).

$$u = s^*H \quad (11)$$

Since the codeword may be quite large, the vector for the unsatisfied counters could also be large. For example, u could have tens of thousands of entries. Therefore, in one embodiment, a histogram, table or the like is constructed to summarize the information in the unsatisfied counters vector (u). FIG. 16 depicts one embodiment of a table 1600 that summaries the unsatisfied counters vector (u). The table 1600 has four rows that represent the four possible hard bit/soft bit combinations for each bit in the codeword, in one embodiment. For example, each bit in the codeword could have one hard bit and one soft bit for four possible values. The table 1600 has entries for different possible values for unsatisfied counters. In this example, each bit in the codeword could have a value between 0-5 for the unsatisfied counters because each bit is connected to up to five check nodes. In other examples, each bit could be connected to up to more or fewer than five check nodes. For each possible hard bit/soft bit combination, the table 1600 has the total number of bits having each possible value for the unsatisfied counters. Note that the table 1600 may serve as an alternate to the bin counts of, for example, FIG. 10A. The four bins in FIG. 10A correspond to the four possible hard bit/soft bit combinations. Hence, rather than having target bin counts as in FIG. 10A, in one embodiment, there are counts of unsatisfied counters for each bin. Note that in the example of table 1600, there are six counts of unsatisfied counters for each bin.

Step 1508 includes estimating mutual information between data programmed into the set and data read from the set of memory cells. The following describes one technique for estimating the mutual information.

In one embodiment, an estimate of the number of errors in each bin is made based on the counts of unsatisfied counters for each bin. In one embodiment, a Maximum Likelihood (ML) estimation method is used to estimate the number of errors in each bin, as shown by Equation 12.

$$\tilde{E}(\underline{C}) = \max_{\underline{E}} Pr(\underline{C} \mid \underline{E}) \quad (12)$$

In Equation 12, C is the vector of unsatisfied counters (or the histogram of the counters—see table 1600) and E is the vector of errors per bin. The intuition behind this estimation, is that we are trying to find the error vector E that best explains the counters (C) that were calculated from reading the set of memory cells. FIG. 17A shows a set of equalities that expand the right hand side of Equation 12. In FIG. 17A, $P_{q|e}/P_{q|c}$ are the probability that bit b has q unsatisfied parity check equations given that bit b is conditioned to be erroneous/correct. $P_{q|e}/P_{q|c}$ may be calculated as depicted in FIGS. 17B and 17C, respectively. In FIGS. 17B and 17C, $d_c$, $d_v$, N are parameters of the ECC code, and L is the number of bins. Specifically, $d_c$ is the check degree, e.g., the number of bits connected to the check node and $d_v$ is the bit or variable degree, e.g., the number of check nodes connected to the bit.

After the error vector is estimated, $p_{y|x}$ may be calculated. Here, x is the data that was programmed into the memory cells, and y is the data that is read back from the memory cells. FIG. 17D depicts an example calculation for $p_{y|x}$. Next, the mutual information (MI) may be determined, as in Equation 13.

$$MI = H(p_y) - H(p_{y|x}) = H(p_{y|x} \cdot p_x) - H(p_{y|x}) \quad (13)$$

Step 1510 includes a determination of whether there are more test soft bit reference levels to consider.

Step 1512 includes reporting soft bit reference levels having the highest mutual information. In one embodiment, the soft bit reference levels are established at levels that will maximize the mutual information.

Figures 18, 19:
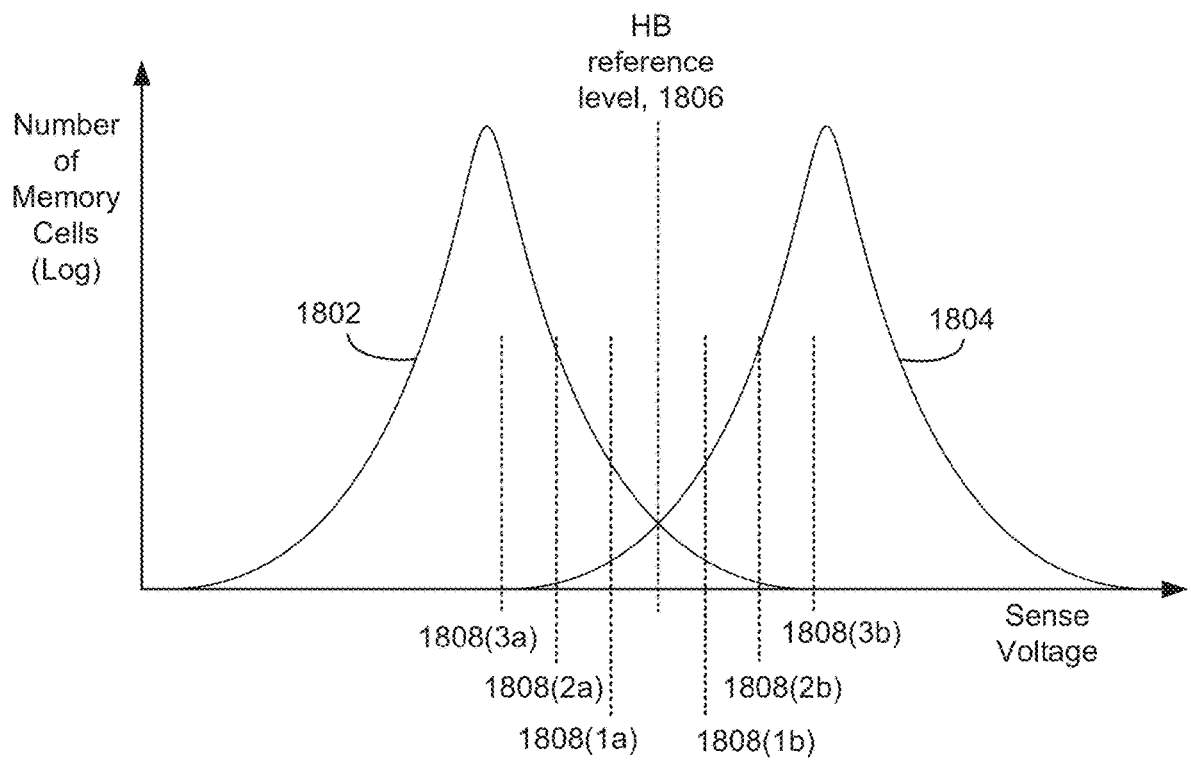
FIG. 18 depicts two memory cell distributions, which correspond to two adjacent data states.
FIG. 19 depicts a flowchart of one embodiment of a process of emulating soft bit reads.

One embodiment includes emulating soft bit reads. Emulating soft bit reads can be used to generate additional soft bits from a relatively few number of test soft bit reads. FIG. 18 depicts two memory cell distributions 1802, 1804, which correspond to two adjacent data states. Hard bit reference level 1806 is used to distinguish between the two adjacent data states (or alternatively to distinguish between the two adjacent memory cell distributions 1802, 1804). A total of six test soft bit reference levels 1808 are depicted. The test soft bit reference levels 1808 are grouped such that three test soft bit reference levels 1808 are on each side of the hard bit reference level 1806.

An example will be described in which three soft bit reads are made, with each read using two of the test soft bit reference levels 1808. A first soft bit read will use test soft bit reference levels 1808(1a) and 1808(1b). A second soft bit read will use test soft bit reference levels 1808(2a) and 1808(2b). A third soft bit read will use test soft bit reference levels 1808(3a) and 1808(3b). Each soft bit read will generate one soft bit of information per memory cell. That soft bit will indicate whether the value for a physical parameter (e.g., Vt, resistance) of the memory cell is "close to" the hard bit reference level 1806, or "far from" the hard bit reference level 1806. Here, "close to" means somewhere between the two test soft bit reference levels 1808 being used, and "far from" means outside of the two test soft bit reference levels 1808 being used.

The information from these three soft bit reads (or from these three soft bits per memory cell) may be used to "emulate" other reads. When "emulating" these other soft bit reads the memory cells are not actually sensed again for the other soft bit reads. For example, the information from these three actual soft bit reads may be used to emulate the following soft bit reads. A first emulated soft bit read corresponds to test soft bit reference levels 1808(1a) and 1808(2b). A second emulated soft bit read corresponds to test soft bit reference levels 1808(1a) and 1808(3b). A third emulated soft bit read corresponds to test soft bit reference levels 1808(2a) and 1808(1b). A fourth emulated soft bit read corresponds to test soft bit reference levels 1808(2a) and 1808(3b). A fifth emulated soft bit read corresponds to test soft bit reference levels 1808(3a) and 1808(1b). A sixth emulated soft bit read corresponds to test soft bit reference levels 1808(3a) and 1808(2b). Note again that the memory cells need not be actually read at these pairs of test soft bit reference levels in order to generate soft bits for these "emulated" soft bit reads. Note that emulating these soft bit reads may also use the hard bits that are obtained from sensing at the hard bit reference level 1806.

Furthermore, note that various bins may be formed based on the various soft bit reads. For example, rather than having only six bins for the three actual soft bit reads, many more bins can be formed.

FIG. 19 depicts a flowchart of one embodiment of a process 1900 of determining a metric, which may be used for calibrating soft bit reference levels, based on emulated soft bit reads. Step 1902 includes performing N soft bit reads to generate N soft bits per memory cell. For example, a first soft bit read will use test soft bit reference levels 1808(1a) and 1808(1b); a second soft bit read will use test soft bit reference levels 1808(2a) and 1808(2b); and a third soft bit read will use test soft bit reference levels 1808(3a) and 1808(3b). The number of soft bit reads could be higher or lower than three.

Step 1904 includes emulating soft bit reads based on the N soft bits to generate a total of N^2 soft bits. Referring back to the example discussed with respect to FIG. 12, the three actual soft bit reads may be used to emulate six other soft bit reads, for a total of nine soft bit reads. Each of these nine soft bit reads produces a soft bit per memory cell. Hence, a total of nine soft bits per memory cell is produced. If there were, for example, five actual soft bit reads, then emulation could be used to produce a total of 25 soft bits per memory cell. Thus, soft bit read emulation is very efficient (e.g., uses few actual soft bit reads) to produce a high number of soft bits per memory cell.

Step 1906 includes determining a metric for respective bins based on the emulated soft bits (and the soft bits that were read). An example will be discussed with reference to FIGS. 12 and 13. As discussed above, five separate soft bit reads can be done at the levels a, b, c, d, and e depicted in FIG. 12. Each soft bit read (in combination with the hard bit read) produces information for calculating one of the five bin counts 1302(a)-1302(e) depicted in FIG. 13. In one embodiment, soft bit read emulation is used to produce additional bin counts. For example, an emulated soft bit read may correspond to a read at level e below the HB reference level 1206 and level a above the HB reference level. Other soft bit reads may be emulated in a manner as described in the discussion of FIG. 18. In one embodiment, a total of 20 soft bit reads may be emulated for the example of FIG. 12. Between the five actual soft bit reads and the 20 emulated soft bit reads, a total of 25 different bin counts may be produced. Thus, instead of the five bin counts in FIG. 13, 25 different bin counts may be produced. One aspect to note about the emulated soft bit reads, is the ability to end up with final soft bit reference levels that are asymmetric with respect to the HB reference level.

In view of the above, it can be seen that a first embodiment includes an apparatus, comprising a communication interface and a control circuit coupled to the communication interface. The control circuit is configured to connect to non-volatile memory cells. The control circuit is configured to sense a set of non-volatile memory cells at a hard bit reference level and a plurality of test soft bit reference levels grouped around the hard bit reference level. The control circuit is configured to determine a metric for the test soft bit reference levels. The control circuit is configured to establish new soft bit reference levels for sensing the set based on the metric for the test soft bit reference levels.

In a second embodiment, and in furtherance of the first embodiment, the metric comprises a percentage of the set having a value for a physical parameter within bins defined by the hard bit reference level and the plurality of test soft bit reference levels. The control circuit is configured to establish the new soft bit reference levels based on a target percentage for the bins.

In a third embodiment, and in furtherance of the second embodiment, the control circuit is further configured to estimate a bit error rate of data stored in the set. The control circuit is further configured to establish the target percentage based on the estimated bit error rate of the set.

In a fourth embodiment, and in furtherance of the second embodiment, the control circuit is further configured to determine a syndrome weight of data read from the set. The control circuit is further configured to establish the target percentage based on the syndrome weight.

In a fifth embodiment, and in furtherance of the first embodiment, the control circuit is further configured to estimate a bit error rate of data read from the set for different bins using the hard bit reference level and the test soft bit reference levels. The control circuit is further configured to establish the new soft bit reference levels based on the bit error rates for different bins.

In a sixth embodiment, and in furtherance of the first or fifth embodiments, the metric comprises unsatisfied counters of data read from the set for different bins defined by the hard bit reference level and the plurality of test soft bit reference levels. The control circuit is further configured to establish the new soft bit reference levels based on the unsatisfied counters.

In a seventh embodiment, and in furtherance of the sixth embodiment, the control circuit is further configured to determine mutual information based on the unsatisfied counters. The mutual information is between data stored in the set and data read from the set. The control circuit is further configured to establish the new soft bit reference levels based on the mutual information.

In an eighth embodiment, and in furtherance of the seventh embodiment, the control circuit is further configured to establish the new soft bit reference levels to maximize the mutual information.

In a ninth embodiment, and in furtherance of any of the first to eighth embodiments, the control circuit is further configured to perform N soft bit reads to generate N soft bits for each memory cell in the set. The control circuit is further configured to emulate soft bit reads based on the N soft bits to generate N^2 soft bits for each memory cell in the set. The control circuit is further configured to determine the metric for the test soft bit reference levels based on the N^2 soft bits.

One embodiment includes a method comprising scanning a set of non-volatile memory cells at a plurality of test soft bit reference levels. The test soft bit reference levels are grouped around a hard bit reference level. The hard bit reference level and the test soft bit reference levels define bins. The method comprises determining a metric for different bins. The method comprises establishing new soft bit reference levels for sensing the set based on the metric for the different bins.

One embodiment includes a non-volatile storage system, comprising non-volatile memory cells. The non-volatile storage system comprises sensing means for sensing a set of the non-volatile memory cells at a plurality of test soft bit reference levels that are grouped around a hard bit reference level. The non-volatile storage system comprises control means for establishing new soft bit reference levels for sensing the set based on counts of memory cells in the set having a value for a physical parameter (e.g., Vt, resistance) in bins defined by the hard bit reference level and the test soft bit reference levels.

In one embodiment, the sensing means for sensing a set of the non-volatile memory cells at a plurality of test soft bit reference levels comprises one or more of state machine 312, address decoders 314, power control 326, read/write circuits 328, and/or sense block 350. In one embodiment, the sensing means performs steps 1104-1106 of process 1100.

In one embodiment, the control means for determining counts of memory cells in the set having a value for a physical parameter (e.g., Vt, resistance) in bins defined by the hard bit reference level and the test soft bit reference levels comprises one or more of state machine 312, processor 220, and/or processor 250. In one embodiment, the control means performs steps 1108-1114 of process 1100.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
   a communication interface; and
   a control circuit coupled to the communication interface, wherein the control circuit is configured to connect to non-volatile memory cells, wherein the control circuit is configured to:
   sense a set of non-volatile memory cells at a hard bit reference level and a plurality of lower test soft bit reference levels on a lower side of the hard bit reference level, and a plurality of upper test soft bit reference levels on an upper side of the hard bit reference level, wherein sensing at the hard bit reference level distinguishes between two data states, wherein sensing at the soft bit reference levels indicates reliability of sensing at the hard bit reference level;
   determine a metric for each bin in each of a plurality of test groups, wherein each test group comprises bins based on sensing at the hard bit reference level, m of the lower test soft bit reference levels, and m of the upper test soft bit reference levels, wherein a different combination of m of the lower test soft bit reference levels and m of the upper test soft bit reference levels are used for each respective test group, wherein m is a positive integer; and
   establish m new lower soft bit reference levels and m new upper soft bit reference levels for sensing the set based on the metrics.

2. The apparatus of claim 1, wherein:
   the metric for each respective bin comprises a percentage of the set having a value for a physical parameter within the respective bin; and
   the control circuit is configured to establish the m new lower and m new upper soft bit reference levels based on a target percentage for each respective bin.

3. The apparatus of claim 2, wherein the control circuit is further configured to:
   estimate a bit error rate of data stored in the set; and
   establish the target percentage for each respective bin based on the estimated bit error rate of the set.

4. The apparatus of claim 2, wherein the control circuit is further configured to:
   determine a syndrome weight of data stored in the set; and
   establish the target percentage based on the syndrome weight.

5. The apparatus of claim 1, wherein the control circuit is further configured to:
   estimate a bit error rate of data read from the set of non-volatile memory cells for different bins for the plurality of test groups; and
   establish the m new lower and m new upper soft bit reference levels based on the bit error rates for the different bins.

6. The apparatus of claim 1, wherein:
   the metric comprises unsatisfied counters of data read from the set for different bins for the plurality of test groups; and
   the control circuit is further configured to establish the m new lower and m new upper soft bit reference levels based on the unsatisfied counters.

7. The apparatus of claim 6, wherein the control circuit is further configured to:
   determine mutual information based on the unsatisfied counters, wherein the mutual information is between data stored in the set and data read from the set; and
   establish the new soft bit reference levels based on the mutual information.

8. The apparatus of claim 7, wherein the control circuit is further configured to:
   establish the new soft bit reference levels to maximize the mutual information.

9. The apparatus of claim 1, wherein the control circuit is further configured to:
   perform N soft bit reads to generate N soft bits for each memory cell in the set;

emulate soft bit reads based on the N soft bits to generate N^2 soft bits for each memory cell in the set; and determine the metric for each bin based on the N^2 soft bits.

10. A method comprising:

sensing a set of non-volatile memory cells at a hard bit reference level, a plurality of lower test soft bit reference levels on a lower side of the hard bit reference level, and a plurality of upper test soft bit reference levels on an upper side of the hard bit reference level, wherein sensing at the hard bit reference level distinguishes between two data states, wherein sensing at the soft bit reference levels indicates reliability of sensing at the hard bit reference level;

forming a plurality of test cases based on the sensing, wherein each test case includes 2 m+2 bins based on sensing at the hard bit reference level, m of the lower test soft bit reference levels, and m of the upper test soft bit reference levels, wherein a different combination of m of the lower test soft bit reference levels and m of the upper test soft bit reference levels are used for each test case, wherein m is a positive integer;

determining a metric for each bin for each test case; and establishing m new lower soft bit reference levels and m new upper soft bit reference levels for sensing the set based on the metrics for the plurality of test cases.

11. The method of claim 10, wherein:

the metric for each bin comprises a count of the memory cells in the set having a value for a physical parameter within the bin; and establishing the new soft bit reference levels for sensing the set comprises establishing the new soft bit reference levels to correspond to a test case that is selected based on a target count for each of the 2 m+2 bins.

12. The method of claim 11, further comprising:

estimating a bit error rate of data stored in the set of the memory cells; and establishing the target count of the memory cells in the set to have a value for a physical parameter within each of the 2 m+2 bins based on the estimated bit error rate.

13. The method of claim 11, further comprising:

determining a syndrome weight of data read from the set; and establishing the target count of the memory cells in the set to have a value for a physical parameter within each of the 2 m+2 bins based on the syndrome weight.

14. The method of claim 10, further comprising:

estimating a bit error rate of data read from the set for different bins using the hard bit reference level and the test soft bit reference levels; and establishing the new soft bit reference levels based on the bit error rates for different bins.

15. The method of claim 10, wherein:

determining the metric for the each bin for each test case comprises determining unsatisfied counters of data read from the set using the hard bit reference level and the test soft bit reference levels; and establishing the new soft bit reference levels is based on the unsatisfied counters.

16. The method of claim 15, further comprising:

determining mutual information based on the unsatisfied counters, wherein the mutual information is between data stored in the set of memory cells and data read from the set of memory cells; and establishing the soft bit reference levels that maximizes the mutual information.

17. A non-volatile storage system, comprising:

non-volatile memory cells;

sensing means for sensing a set of the non-volatile memory cells at a hard bit reference voltage, a plurality of lower test soft bit reference voltages having a voltage less than the hard bit reference voltage, and a plurality of upper test soft bit reference voltages having a voltage greater than the hard bit reference voltage, wherein sensing at the hard bit reference voltage distinguishes between two data states, wherein sensing at the soft bit reference voltages indicates reliability of sensing at the hard bit reference voltage; and control means for establishing m new lower soft bit reference voltages and m new upper soft bit reference voltages for sensing the set based on counts of memory cells in the set having a value for a physical parameter in respective bins in each of a plurality of test groups, wherein each test group includes 2 m+2 bins based on sensing at the hard bit reference voltage, m of the lower test soft bit reference voltages, and m of the upper test soft bit reference voltages, wherein a different combination of m of the lower test soft bit reference voltages and m of the upper test soft bit reference voltages are used for each test case, wherein m is a positive integer.

18. The non-volatile storage system of claim 17, wherein the control means is further for:

accessing a target bin count for each of the 2 m+2 bins; and establishing the new soft bit reference voltages based on a test group having bins with counts closest to the target bin counts.

19. The non-volatile storage system of claim 18, wherein the control means is further for:

estimating a bit error rate of data read from the set of memory cells using the hard bit reference voltage and current values of the soft bit reference voltages; and selecting the target bin count based on the estimated bit error rate.

20. The non-volatile storage system of claim 18, wherein the control means is further for:

determining a syndrome weight of data read from the set of memory cells using the hard bit reference voltage and present values of the soft bit reference voltages; and selecting the target bin counts based on the syndrome weight.

* * * * *